US012603627B2

(12) United States Patent (10) Patent No.: US 12,603,627 B2
Kobayashi et al. (45) Date of Patent: Apr. 14, 2026

(54) METHOD FOR MANUFACTURING VIBRATION ELEMENT

(71) Applicant: SEIKO EPSON CORPORATION, Tokyo (JP)

(72) Inventors: Takuro Kobayashi, Minowa (JP); Hiyori Sakata, Shinagawa (JP); Akinori Yamada, Ina (JP)

(73) Assignee: SEIKO EPSON CORPORATION (JP)

( * ) Notice: Subject to any disclaimer, the term of this patent is extended or adjusted under 35 U.S.C. 154(b) by 726 days.

(21) Appl. No.: 17/986,063

(22) Filed: Nov. 14, 2022

(65) Prior Publication Data

US 2023/0155564 A1 May 18, 2023

(30) Foreign Application Priority Data

Nov. 15, 2021 (JP) ................................. 2021-185446

(51) Int. Cl.
  *H03H 3/02* (2006.01)
  *H03H 9/215* (2006.01)
(52) U.S. Cl.
  CPC .............. *H03H 3/02* (2013.01); *H03H 9/215* (2013.01); *H03H 2003/026* (2013.01)
(58) Field of Classification Search
  CPC .............. H03H 2003/026; H03H 3/02; H03H 9/02157; H03H 9/215
  See application file for complete search history.

(56) References Cited

U.S. PATENT DOCUMENTS

2007/0222342 A1 9/2007 Hokibara et al.
2009/0077781 A1 3/2009 Amano

2023/0126632 A1* 4/2023 Shiraishi ................ H03H 9/215
                                                        29/25.35
2023/0127801 A1* 4/2023 Shiraishi .................. H03H 3/02
                                                        310/370
2023/0139089 A1* 5/2023 Park .................... H04L 63/0236
                                                        726/1
2023/0155564 A1* 5/2023 Kobayashi ............. H03H 9/215
                                                        29/25.35

FOREIGN PATENT DOCUMENTS

JP      2007-013382 A      1/2007
JP      2007-259036 A      10/2007
JP      2009-081521 A      4/2009
JP      2018-148380 A      9/2018

* cited by examiner

*Primary Examiner* — Minh N Trinh
(74) *Attorney, Agent, or Firm* — Harness, Dickey & Pierce, P.L.C.

(57) ABSTRACT

A vibration element manufacturing method includes a first dry etching step of dry-etching a quartz crystal substrate from the first surface side to form first grooves and the outer shapes of first and second vibrating arms, a second dry etching step of dry-etching the quartz crystal substrate from the second surface side to form second grooves and the outer shapes, and a wet etching step of wet-etching the side surfaces of the first and second vibrating arms, the first grooves, and the second grooves to form inclining surfaces that couple bottom surfaces to in-groove side surfaces of the first and second grooves, and the first and second grooves satisfy the relationship of $D1/D \geq 0.80$, where D represents the depth of each of the first and second grooves, and D1 represents the result of subtraction of the length of the inclining surfaces in a direction Z from the depth in each of the first and second grooves.

7 Claims, 24 Drawing Sheets

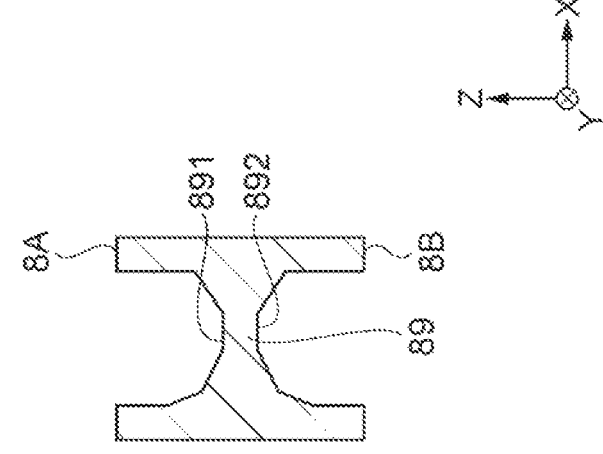
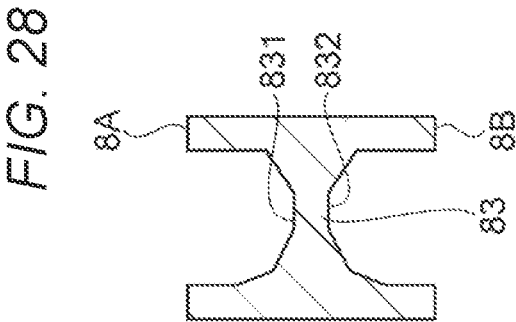
*FIG. 28*
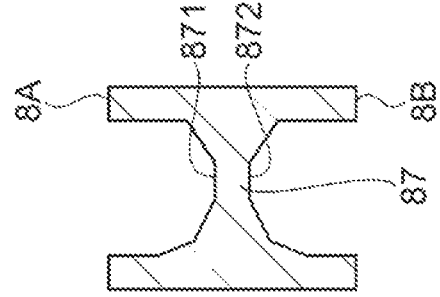

9A

921

922

92    9B

9A

931

932

9B    93

9A

941

942

94    9B

9A

951

952

9B    95

METHOD FOR MANUFACTURING VIBRATION ELEMENT

The present application is based on, and claims priority from JP Application Serial Number 2021-185446, filed Nov. 15, 2021, the disclosure of which is hereby incorporated by reference herein in its entirety.

BACKGROUND

1. Technical Field

The present disclosure relates to a method for manufacturing a vibration element.

2. Related Art

JP-A-2007-013382 describes a method for manufacturing a vibration element including a pair of grooved vibrating arms and formed by dry etching. In the manufacturing method described in JP-A-2007-013382, a substrate made of a piezoelectric material is so dry-etched that the width of the grooves is smaller than the width of the space between the pair of vibrating arms to allow the micro-loading effect to make the etched grooves shallower than the etched space between the pair of vibrating arms. The grooves and the outer shape of the vibration element are thus formed all at once.

In the vibration element manufacturing method described in JP-A-2007-013382, however, dry etching is performed on both the front and rear surfaces of the substrate, a stepped portion can be undesirably formed at the side surface of each of the vibrating arms due to positional shift between the photoresist film formed at the front surface of the substrate and the photoresist film formed at the rear surface of the substrate. The stepped portion formed at the side surface of each of the vibrating arms causes problems of occurrence of unwanted vibration and damage such as cracking and chipping that originates from the stepped portions and occurs when impact acts on the vibration element.

SUMMARY

A method for manufacturing a vibration element is a method for manufacturing a vibration element including a first vibrating arm and a second vibrating arm extending along a first direction and arranged side by side along a second direction that intersects with the first direction, the first and second vibrating arms each having a first surface and a second surface being front and rear sides with respect to each other and arranged side by side in a third direction that intersects with the first and second directions, a bottomed first groove that opens to the first surface, a bottomed second groove that opens to the second surface, and a side surface that couples the first surface and the second surface to each other, the method including a preparation step of preparing a quartz crystal substrate having the first surface and the second surface, a first dry etching step of dry-etching the quartz crystal substrate from a first surface side to form the first grooves and outer shapes of the first and second vibrating arms, a second dry etching step of dry-etching the quartz crystal substrate from a second surface side to form the second grooves and the outer shapes of the first and second vibrating arms, and a subsequent wet etching step of wet-etching the side surfaces of the first and second vibrating arms, the first grooves, and the second grooves to form inclining surfaces that couple bottom surfaces to in-groove side surfaces of the first and second grooves, and the first and second grooves satisfy a relationship of D1/D ≥0.80, where D represents a depth of each of the first and second grooves, and D1 represents a result of subtraction of a length of the inclining surfaces in the third direction from the depth in each of the first and second grooves.

BRIEF DESCRIPTION OF THE DRAWINGS

FIG. 1 is a plan view showing a vibration element according to a first embodiment.

FIG. 28 is a cross-sectional view of the vibration element taken along the line A5-A5 in FIG. 26.

DESCRIPTION OF EXEMPLARY EMBODIMENTS

1. First Embodiment

A method for manufacturing a vibration element according to a first embodiment will be described.

The configuration of the vibration element 1 will first be described with reference to FIGS. 1 and 2, and the method for manufacturing the vibration element 1 will next be described with reference to FIGS. 3 to 18.

The figures excluding part thereof show axes X, Y, and Z, which are three axes that intersect with one another, for convenience of description. In the present embodiment, the three axes are perpendicular to one another. The direction along the axis X is also called a direction X, the direction along the axis Y is also called a direction Y, and the direction along the axis Z is also called a direction Z. The direction Y corresponds to a first direction, the direction X corresponds to a second direction, and the direction Z corresponds to a third direction. The side facing the arrow attached to each of the axes is also called a positive side, and the side opposite from the positive side is also called a negative side. The positive side of the direction Z is also called an "upper side", and the negative side of the direction Z is also called a "lower side". A plan view viewed in the direction Z is also simply called a "plan view". The axes X, Y, and Z correspond to the crystal axes of quartz crystal, as will be described later.

Figure 1:
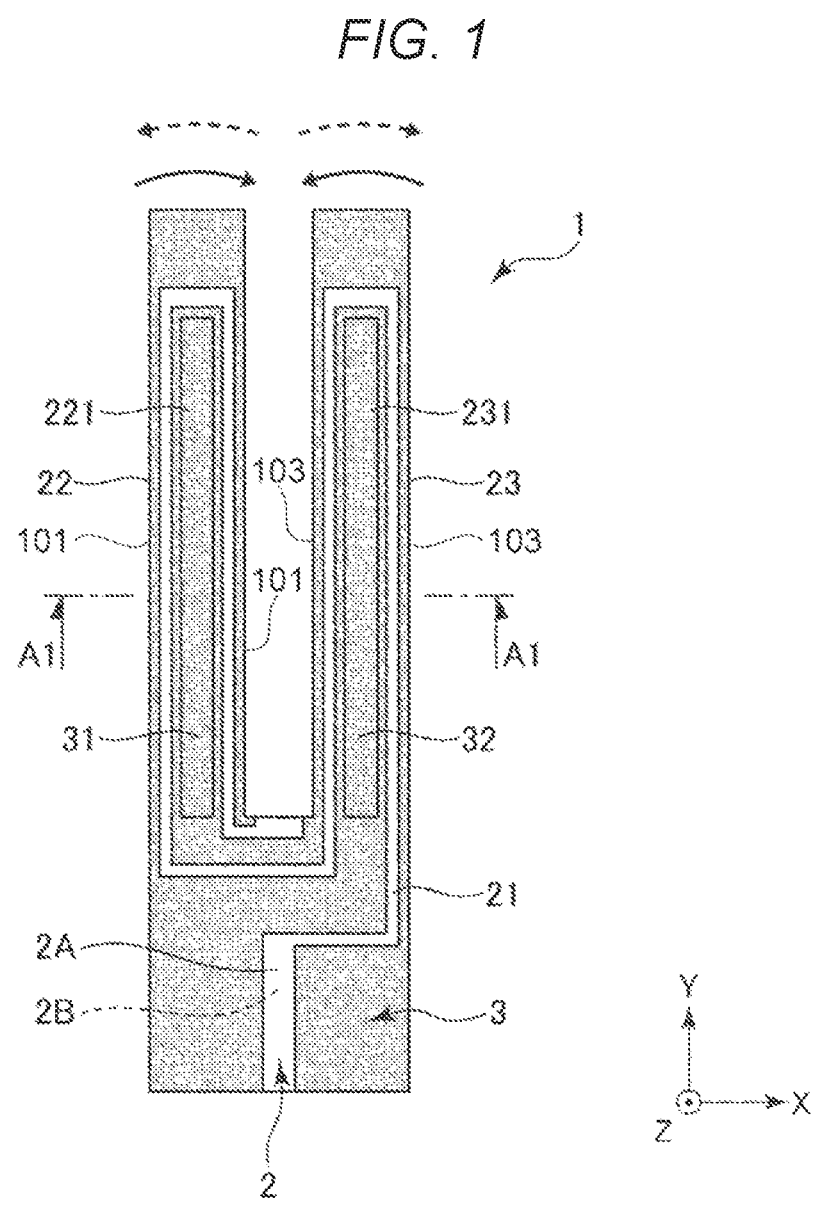
Figure 2:
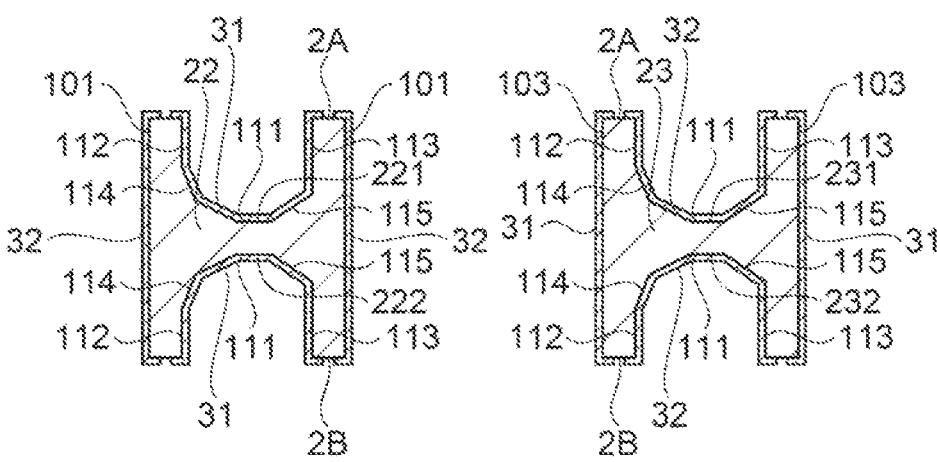
FIG. 2 is a cross-sectional view of the vibration element taken along the line A1-A1 in FIG. 1.
Figure 2:
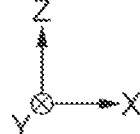
Figure 3:
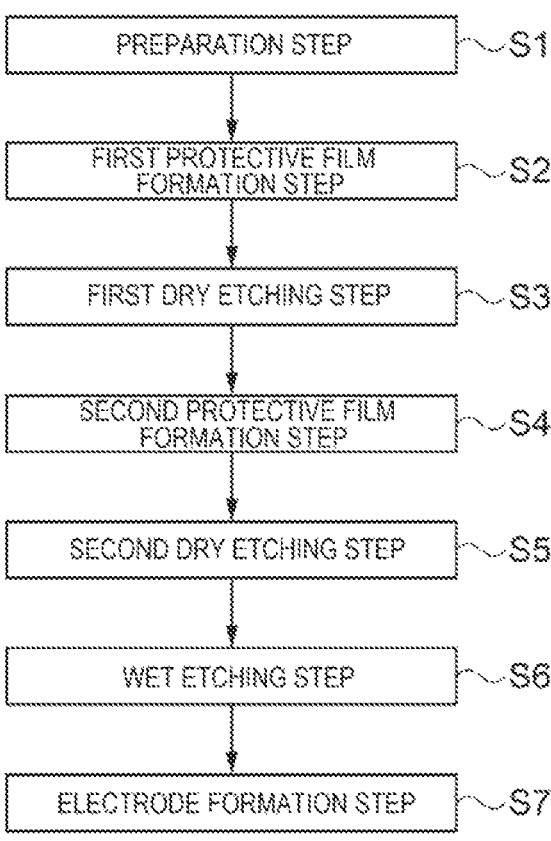
FIG. 3 shows steps of manufacturing the vibration element according to the first embodiment.

The vibration element 1 is a tuning-fork-type vibration element and includes a vibration substrate 2 and an electrode 3 formed at the front surface of the vibration substrate 2, as shown in FIGS. 1 and 2.

The vibration substrate 2 is formed by patterning a Z-cut quartz crystal substrate as a Z-cut quartz crystal plate into a desired shape, spreads in the plane X-Y defined by the axes X and Y, which are the crystal axes of quartz crystal, and has a thickness in the direction Z. The axis X is also called an electrical axis, the axis Y is also called a mechanical axis, and the axis Z is also called an optical axis.

The vibration substrate 2 has the shape of a plate and has a first surface 2A and a second surface 2B, which are front and rear sides with respect with each other and arranged side by side in the direction Z. The vibration substrate 2 has a base 21, and a first vibrating arm 22 and a second vibrating arm 23 extending from the base 21 along the direction Y and arranged side by side along the direction X.

The first vibrating arm 22 has a bottomed first groove 221, which opens to the first surface 2A, a bottomed second groove 222, which opens to the second surface 2B, and a side surface 101, which couples the first surface 2A and the second surface 2B to each other. Similarly, the second vibrating arm 23 has a bottomed first groove 231, which opens to the first surface 2A, a bottomed second groove 232, which opens to the second surface 2B, and a side surface 103, which couples the first surface 2A and the second surface 2B to each other. The first grooves 221 and 231 and the second grooves 222 and 232 extend along the direction Y, and the inner surface of each of the grooves forms a bottom surface 111, in-groove side surfaces 112 and 113, and inclining surfaces 114 and 115. The in-groove side surfaces 112 and 113 face each other, the in-groove side surface 112, which faces the negative side of the direction X, is coupled to the bottom surface 111 via the inclining surface 114, and the in-groove side surface 113, which faces the positive side of the direction X, is coupled to the bottom surface 111 via the inclining surface 115. The first vibrating arm 22 and the second vibrating arm 23 thus each have a substantially H-shaped cross-sectional shape. The thus configured vibration element 1 has a reduced thermoelastic loss and excellent vibration characteristics. The bottom surfaces 111 are each a portion at the deepest position in the direction Z separate from the first surface 2A or the second surface 2B, and may not necessarily be parallel to the plane X-Y. For example, the first grooves 221 and 231 and the second grooves 222 and 232 may be so shaped that the inclining surfaces 114 and 115 intersect with each other. In this case, the ridge line that couples the inclining surfaces 114 and 115 to each other corresponds to the bottom surface 111.

The electrode 3 includes a signal electrode 31 and a ground electrode 32. The signal electrode 31 is disposed at the first surface 2A and the second surface 2B of the first vibrating arm 22 and the side surface 103 of the second vibrating arm 23. On the other hand, the ground electrode 32 is disposed at the side surface 101 of the first vibrating arm 22 and the first surface 2A and the second surface 2B of the second vibrating arm 23. When a drive signal is applied to the signal electrode 31 with the ground electrode 32 grounded, the first vibrating arm 22 and the second vibrating arm 23 perform flexural vibration in the direction X, in which the two vibrating arms repeatedly approach each other and separate from each other, as indicated by the arrows in FIG. 1.

The vibration element 1 has been briefly described above.

The method for manufacturing the vibration element 1 will next be described. The method for manufacturing the vibration element 1 includes a preparation step S1 of preparing a quartz crystal substrate 20, which is the base material of the vibration substrate 2, a first protective film formation step S2 of forming a first protective film 5 at the first surface 2A of the quartz crystal substrate 20, a first dry etching step S3 of dry-etching the quartz crystal substrate 20 from the side facing the first surface 2A via the first protective film 5, a second protective film formation step S4 of forming a second protective film 6 at the second surface 2B of the quartz crystal substrate 20, a second dry etching step S5 of dry-etching the quartz crystal substrate 20 from the side facing the second surface 2B via the second protective film 6, a wet etching step S6 of wet-etching the quartz crystal substrate 20, and an electrode formation step S7 of forming the electrode 3 at the front surface of the vibration substrate 2 produced by the steps described above, as shown in FIG. 3.

The steps described above will be sequentially described below.

Preparation Step S1

Figure 4:
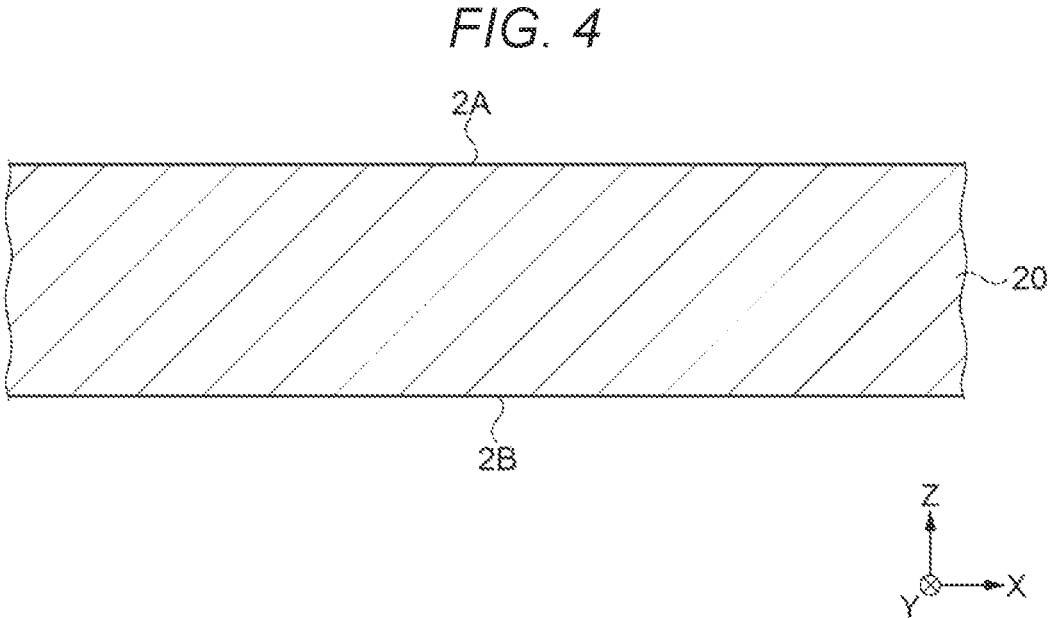
FIG. 4 is a cross-sectional view for describing a method for manufacturing the vibration element.

The quartz crystal substrate 20, which is the base material of the vibration substrate 2, is prepared, as shown in FIG. 4. The quartz crystal substrate 20 has been prepared, for example, by chemical mechanical polishing (CMP) in the form of a substrate having a desired thickness and has a sufficiently smooth first surface 2A and second surface 2B. A plurality of vibration elements 1 are formed all at once from the quartz crystal substrate 20.

First Protective Film Formation Step S2

Figure 5:
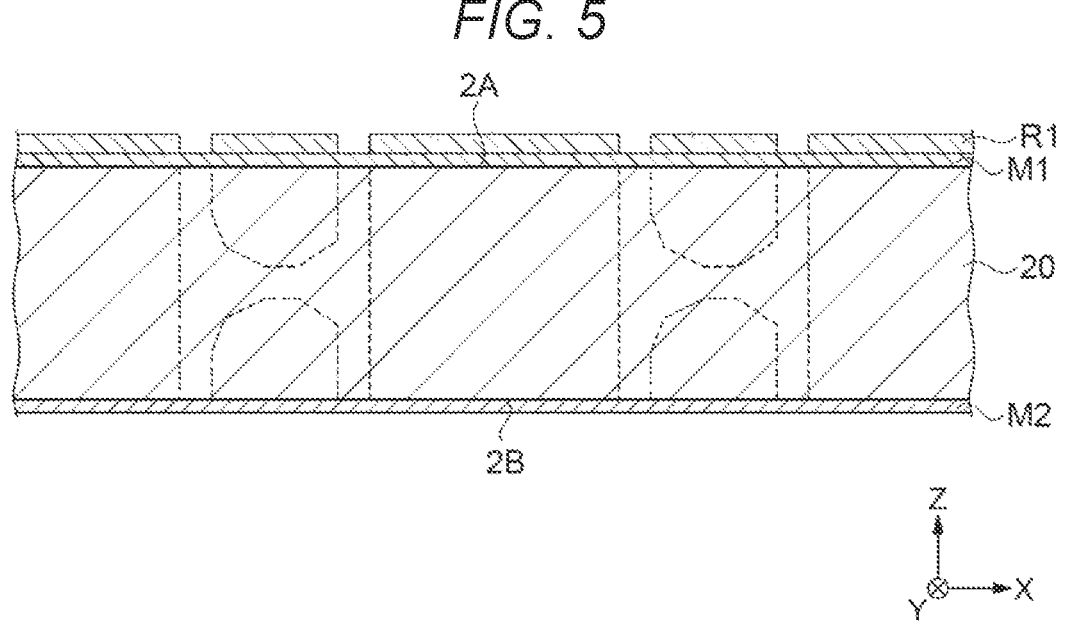
FIG. 5 is a cross-sectional view for describing the method for manufacturing the vibration element.
Figure 6:
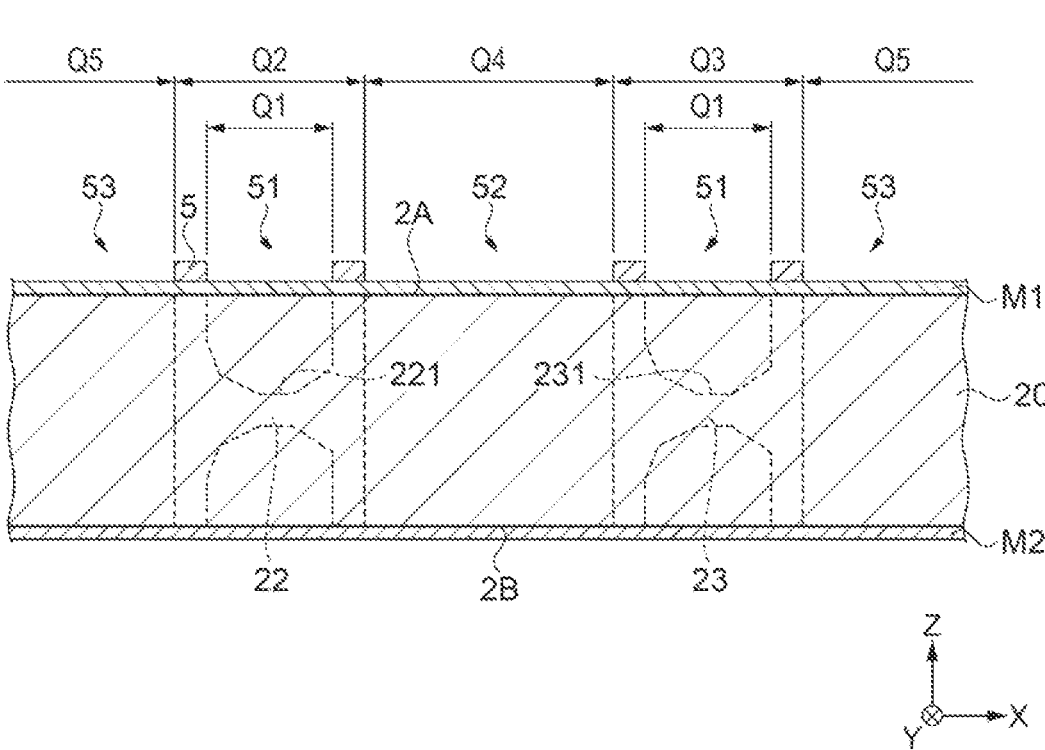
FIG. 6 is a cross-sectional view for describing the method for manufacturing the vibration element.

A metal film M1 is deposited at the first surface 2A of the quartz crystal substrate 20, and a metal film M2 is deposited at the second surface 2B of the quartz crystal substrate 20, as shown in FIG. 5. Thereafter, a first photoresist film R1 is deposited on the metal film M1, and the deposited first photoresist film R1 is patterned. Thereafter, the first protective film 5 is deposited at the openings of the first resist film R1, and then the first photoresist film R1 is removed. As a result, the structure shown in FIG. 6 is achieved. The first protective film 5 is not particularly limited to a specific film and can be any of a variety of metal masks that are resistant to etching, such as a nickel mask.

The first protective film 5 has openings 51, 52, and 53 in portions where the quartz crystal substrate 20 should be removed. Out of the openings, the opening 51 coincides with a first groove formation area Q1, where the first grooves 221 and 231 are formed. The opening 52 coincides with an inter-arm area Q4, which is located between a first vibrating arm formation area Q2, where the first vibrating arm 22 is formed, and a second vibrating arm formation area Q3, where the second vibrating arm 23 is formed. The opening 53 coincides with an inter-device area Q5, which is located between adjacent vibration substrates 2. That is, the first protective film 5 is formed in the area excluding the first groove formation area Q1, the inter-arm area Q4, and the inter-device area Q5.

First Dry Etching Step S3

Figure 7:
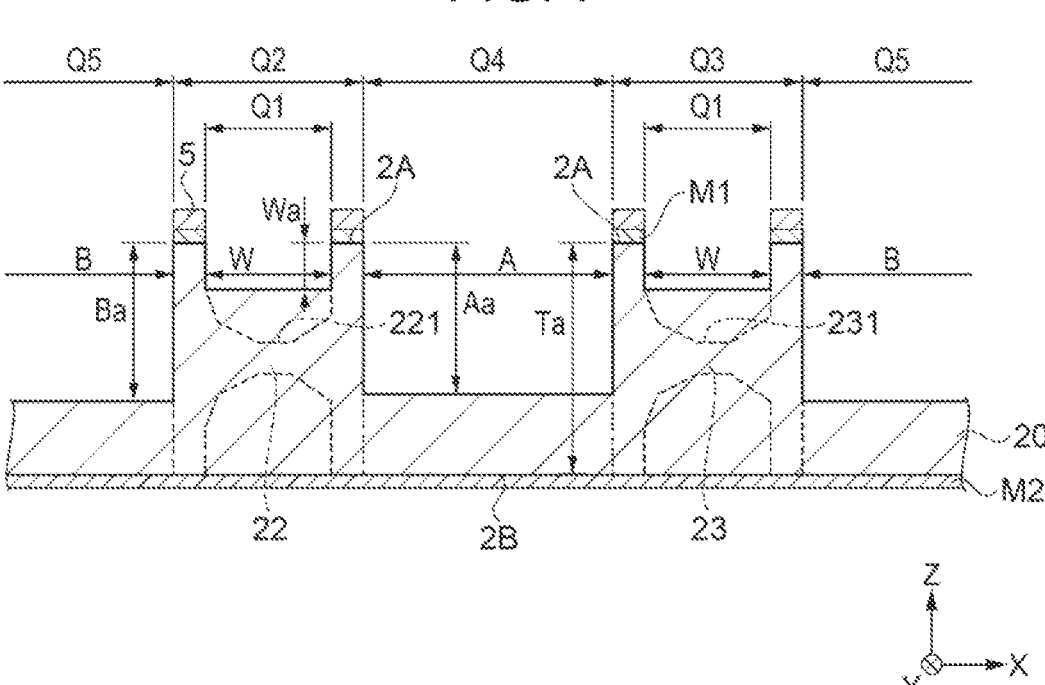
FIG. 7 is a cross-sectional view for describing the method for manufacturing the vibration element.

The quartz crystal substrate 20 is dry-etched from the side facing the first face 2A via the first protective film 5 to simultaneously form the first grooves 221 and 231 in the first surface 2A and the outer shape of the vibration substrate 2, that is, the outer shapes of the first vibrating arm 22 and the second vibrating arm 23, as shown in FIG. 7. The phrase "simultaneously form" means that two features are formed all at once in a single step. More specifically, the present step is reactive ion etching and is performed by using a reactive ion etching apparatus (RIE apparatus). The reaction gas introduced into the RIE apparatus is not limited to a specific gas and may, for example, be $SF_6$, $CF_4$, $C_2F_4$, $C_2F_6$, $C_3F_6$, or $C_4F_8$.

The present step ends when the first grooves 221 and 231 reach a desired depth. It is known that the "micro-loading effect", which lowers the etching rate as the pattern density of the first protective film 5 increases, occurs in dry etching. In the present embodiment, comparison between a width W of each of the first grooves 221 and 231, which is the width in the direction X, and a width A of the inter-arm area Q4, which is the width in the direction X, shows that W<A. Comparison between the width W and a width B of the inter-device area Q5, which is the width in the direction X, shows that W<B. The micro-loading effect therefore causes the etching rate in the first groove formation area Q1 to be lower than that in the inter-arm area Q4 and the inter-device area Q5. Therefore, at the end of the present step, a depth Wa of the first grooves 221 and 231 is smaller than depths Aa and Ba of the outer shape of the vibration substrate 2. That is, Wa<Aa (Wa/Aa<1) and Wa<Ba (Wa/Ba<1) are satisfied. The depths Aa and Ba are each greater than or equal to half the thickness of the quartz crystal substrate 20. That is, let Ta be the thickness of the quartz crystal substrate 20, and Aa ≥0.5 Ta and Ba ≥0.5 Ta are satisfied.

After the present step is completed, the first protective film 5 and the metal film M1 are removed, and the rear surface of the quartz crystal substrate 20 is ready to be processed.

Second Protective Film Formation Step S4

Figure 8:
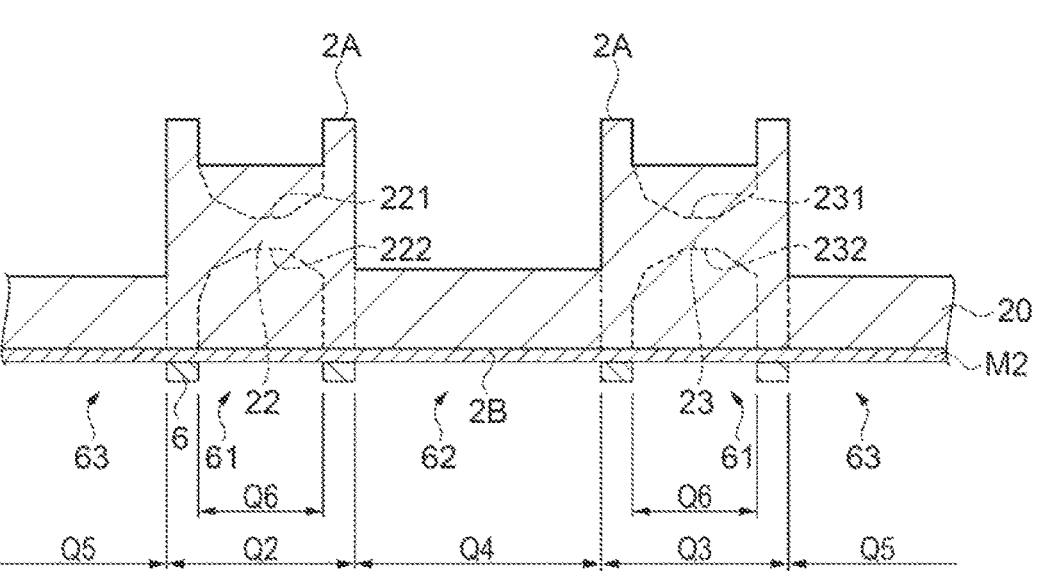
FIG. 8 is a cross-sectional view for describing the method for manufacturing the vibration element.
Figure 8:

The second protective film 6 is deposited on the metal film M2, as shown in FIG. 8. The method for depositing the second protective 6 film is the same as the aforementioned method for depositing the first protective film 5. The second protective film 6 has openings 61, 62, and 63 in portions where the quartz crystal substrate 20 should be removed. Out of the openings, the opening 61 coincides with a second groove formation area Q6, where the second grooves 222 and 232 are formed. The opening 62 coincides with the inter-arm area Q4. The opening 63 coincides with the inter-device area Q5.

Second Dry Etching Step S5

Figure 9:
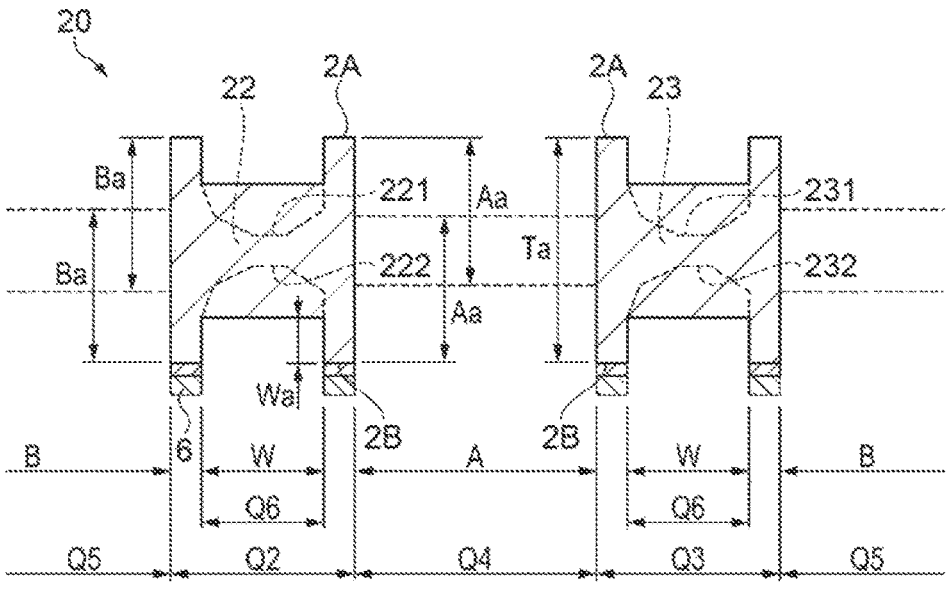
FIG. 9 is a cross-sectional view for describing the method for manufacturing the vibration element.
Figure 9:
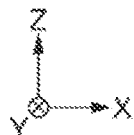

The quartz crystal substrate 20 is dry-etched from the side facing the second face 2B via the second protective film 6 to simultaneously form the second grooves 222 and 232 in the second surface 2B and the outer shape of the vibration substrate 2, that is, the outer shapes of the first vibrating arm 22 and the second vibrating arm 23, as illustrated in FIG. 9. The present step is executed as the first dry etching step S3 is.

The present step ends when the second grooves 222 and 232 reach a desired depth. In the present embodiment, comparison between the width W of the second grooves 222 and 232, which is the width in the direction X, and the width A of the inter-arm area Q4, which is the width in the direction X, shows that W<A. Comparison between the width W and the width B of the inter-device area Q5, which is the width in the direction X, shows that W<B. The micro-loading effect therefore causes the etching rate in the second groove formation area Q6 to be lower than that in the inter-arm area Q4 and the inter-device area Q5. Therefore, at the end of the present step, the depth Wa of the second grooves 222 and 232 is smaller than the depths Aa and Ba of the outer shape of the vibration substrate 2. That is, Wa<Aa (Wa/Aa<1) and Wa<Ba (Wa/Ba<1) are satisfied. The depths Aa and Ba are each greater than or equal to half the thickness of the quartz crystal substrate 20. That is, Aa ≥0.5 Ta and Ba ≥0.5 Ta are satisfied. The inter-arm area Q4 and the inter-device area Q5 therefore pass through the quartz crystal substrate 20. The inter-arm area Q4 and the inter-device area Q5 passing through the quartz crystal substrate 20 form the first vibrating arm 22 and the second vibrating arm 23.

Figure 10:
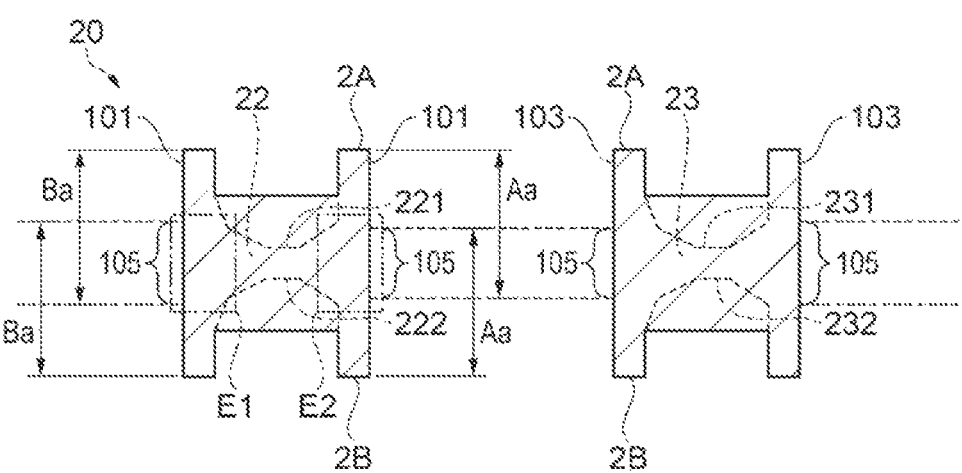
FIG. 10 is a cross-sectional view for describing the method for manufacturing the vibration element.
Figure 10:

After the present step is completed, the second protective film 6 and the metal film M2 are removed, as shown in FIG. 10.

As described above, in the first dry etching step S3, the quartz crystal substrate 20 is dry-etched from the side facing the first surface 2A, and in the second dry etching step S5, the quartz crystal substrate 20 is dry-etched from the side facing the second surface 2B to form the outer shape of the vibration substrate 2. Therefore, for example, when the positions of the first protective film 5 and the second protective film 6 shift from each other in the plan view viewed in the direction Z due to manufacturing variations, a stepped portion is formed in some cases in each of the side surface 101 of the first vibrating arm 22 and the side surface 103 of the second vibrating arm 23 in an area 105, where the dry etching in the first dry etching step S3 and the dry etching in the second dry etching step S5 are both performed.

Figures 11, 12:
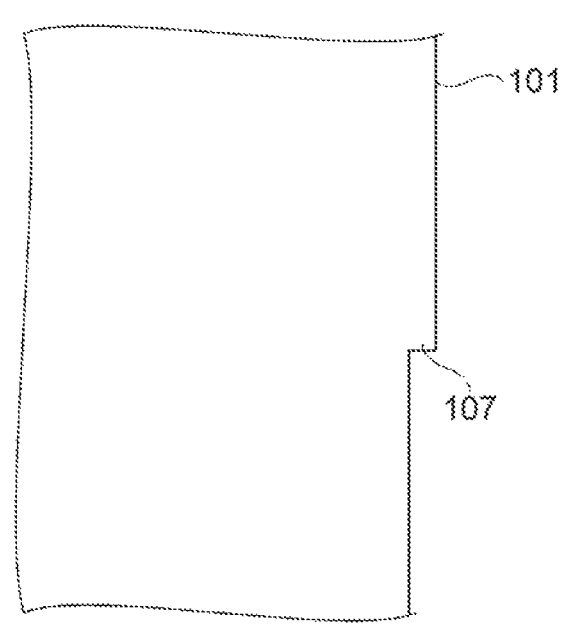
FIG. 11 is a cross-sectional view corresponding to the position of a section E1 in FIG. 10.
FIG. 12 is a cross-sectional view corresponding to the position of a section E2 in FIG. 10.

For example, when the position of the second protective film 6 shifts toward the negative side of the direction X from the position of the first protective film 5, a stepped portion 107 is formed at the side surface 101 of the first vibrating arm 22 because the outer shape of the vibration substrate 2 formed in the second dry etching step S5 shifts toward the negative side of the direction X from the outer shape of the vibration substrate 2 formed in the first dry etching step S3, as shown in FIGS. 11 and 12. Similarly, when the position of the second protective film 6 shifts toward the positive side of the direction X from the position of the first protective film 5, for example, the stepped portion 107 is formed. The above description has been made with reference to the first vibrating arm 22 by way of example, and the stepped portion 107 is similarly formed at the side surface 103 of the second vibrating arm 23 when position of the second protective film 6 shifts from the position of the first protective film 5.

Wet Etching Step S6

The wet etching step S6 is the step of wet-etching the quartz crystal substrate 20 by immersing the quartz crystal substrate 20 in an etchant. The etchant can be hydrofluoric acid or ammonium fluoride.

The first vibrating arm 22 and the second vibrating arm 23 are formed as part of the quartz crystal substrate 20 by the first dry etching step S3 and the second dry etching step S5, as described above. That is, the present step is the step of wet-etching the first vibrating arm 22 and the second vibrating arm 23, and specifically, the step of wet-etching the side surfaces 101 and 103, the first grooves 221 and 231, and the second grooves 222 and 232 of the first vibrating arm 22 and the second vibrating arm 23. In the present step, wet-etching the side surfaces 101 and 103 of the first vibrating arm 22 and the second vibrating arm 23 allows reduction in the size of the stepped portions 107 formed at the side surfaces 101 and 103. Smaller stepped portions 107 prevent unwanted vibration from occurring when the vibration element 1 is caused to vibrate and the vibration element 1 from being damaged when impact acts thereon.

Figure 13:
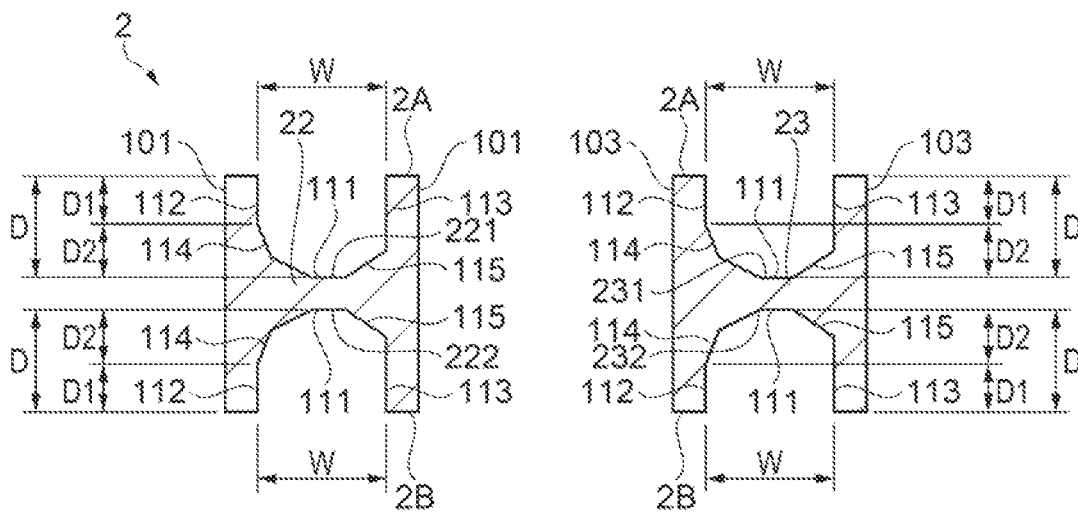
FIG. 13 is a cross-sectional view for describing the method for manufacturing the vibration element.
Figure 13:
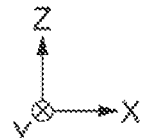

In the present step, wet-etching the first grooves 221 and 231 and the second grooves 222 and 232 causes the inner surfaces of the first grooves 221 and 231 and the second grooves 222 and 232 to form the inclining surfaces 114 and 115 and the bottom surfaces 111, as shown in FIG. 13.

Let D1 be the depth of a groove formed in the first dry etching step S3 and the second dry etching step S5, and D2 be the depth of a groove formed in the wet etching step S6, and the final groove depth D after the wet etching step S6, that is, the distance in the direction Z from the first surface 2A or the second surface 2B to the bottom surface 111 is D1+D2. The depth D1 is equal to the depth Wa described above. The depth D1 can be regarded as the distance in the direction Z from one of the boundary between the in-groove side surface 112 and the inclining surface 114 and the boundary between the in-groove side surface 113 and the inclining surface 115, the boundary farther from the bottom surface 111, to the first surface 2A or second surface 2B. The depth D2 can be regarded as the distance in the direction Z from the aforementioned boundary farther from the bottom surface 111 to the bottom surface 111. In the present embodiment, the depth D1 is the distance in the direction Z from the boundary between the in-groove side surface 112 and the inclining surface 114 to the first surface 2A or the second surface 2B, and the depth D2 is the distance in the direction Z from that boundary to the bottom surface 111. That is, the depth D2 is the length of the inclining surface 114 in the direction Z, and depth D1 is the result of subtraction of the depth D2 from the depth D.

Figure 14:
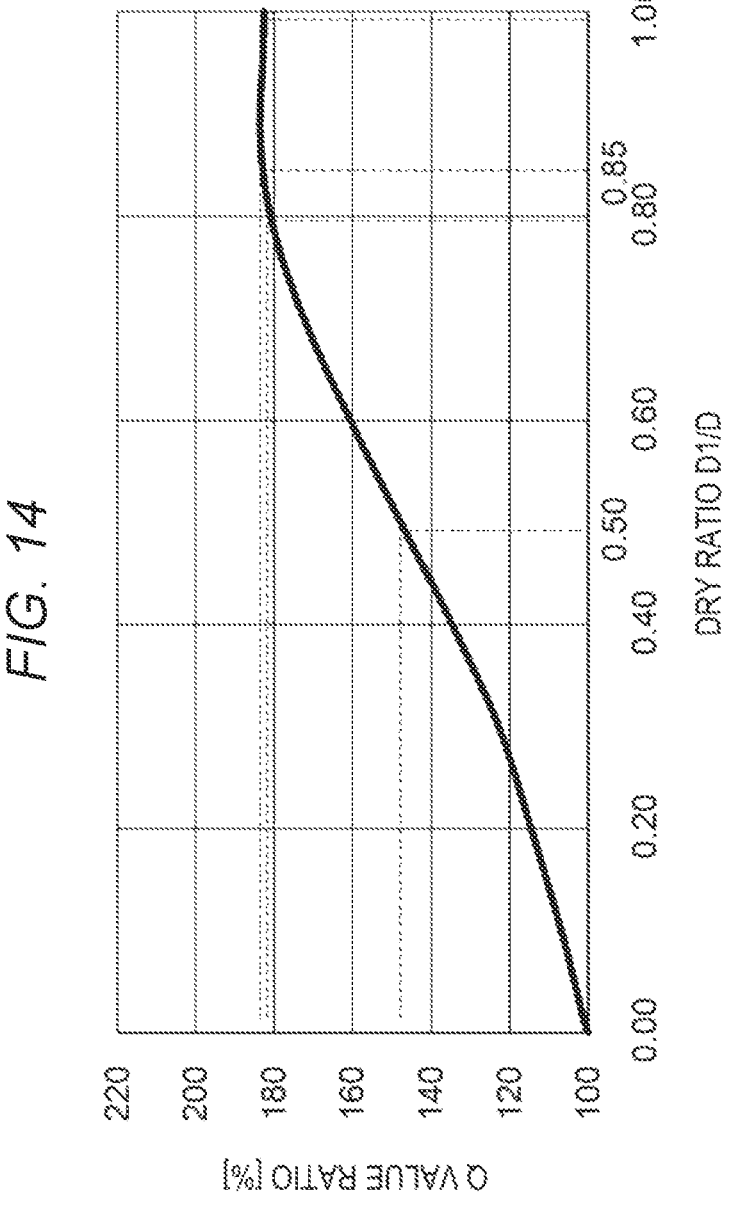
FIG. 14 is a graph showing the relationship between a dry ratio and a Q value ratio.

FIG. 14 is a graph showing the result of a simulation of the relationship between a dry ratio D1/D and a Q value ratio. The dry ratio D1/D is the ratio of the depth D1 of the groove formed by the dry etching to the final depth D of the groove. The Q value ratio is a normalized Q value of the vibration element 1, provided that the Q value of the vibration element 1 manufactured under the condition that the dry ratio D1/D is 0, that is, the Q value achieved when the first grooves 221 and 231 and the second grooves 222 and 232 are formed only by the wet etching is regarded as 100%. The Q value of the vibration element 1 changes in accordance with a change in the dry ratio D1/D, as shown in FIG. 14. Specifically, as the dry ratio D1/D increases, the Q value also increases, and when the dry ratio D1/D falls within a range D1/D ≥0.80, the Q value is substantially constant. The substantially constant Q value is comparable to the Q value achieved when the dry ratio D1/D is 1.00, that is, the Q value achieved when an ideally shaped first vibration arm 22 and second vibration arm 23 with no stepped portion 107 are formed by the dry etching alone. Forming the first grooves 221 and 231 and the second grooves 222 and 232 in such a way that the dry ratio D1/D ≥0.80 is satisfied as described above can greatly improve the Q value as compared with the case where the grooves are formed by the dry etching alone.

Figure 15:
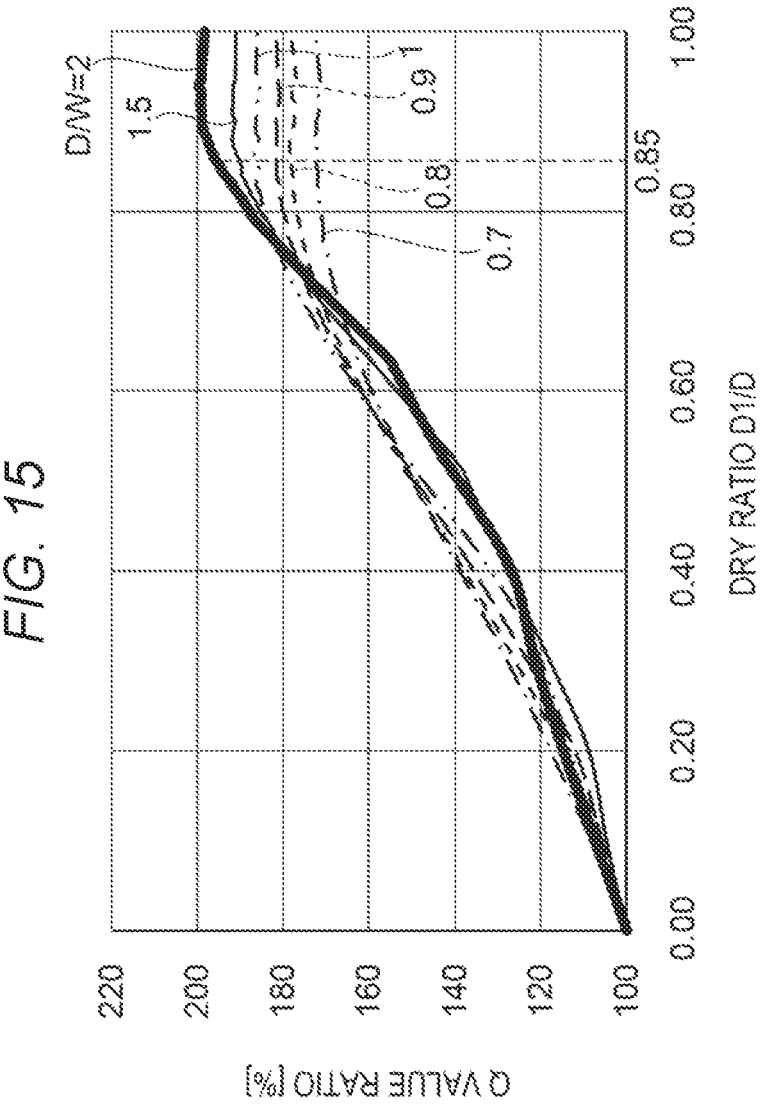
FIG. 15 shows graphs illustrating the relationship between the dry ratio and the Q-value ratio in response to changes in an aspect ratio.

FIG. 15 shows graphs illustrating the results of the simulation of the relationship between the dry ratio D1/D and the Q-value ratio in response to changes in an aspect ratio D/W, which is the ratio of the groove depth D to the groove width W. Even when the aspect ratio D/W changes, causing the dry ratio D1/D to fall withing the range D1/D ≥0.80 can greatly improve the Q value, as shown in FIG. 15. Furthermore, forming the first grooves 221 and 231 and the second grooves 222 and 232 in such a way that the dry ratio D1/D falls within a range D1/D ≥0.85 can achieve a better Q value.

In the wet etching step S6, the amount by which the side surfaces 101 and 103 are etched is preferably greater than or equal to 0.01 μm. The thus set etching amount reduces the size of the stepped portions 107, preventing unwanted vibration from occurring when the vibration element 1 is caused to vibrate and the vibration element 1 from being damaged when impact acts thereon. The amount by which the side surfaces 101 and 103 are etched is the amount of displacement, before and after the wet etching step S6, of the side surfaces 101 and 103 in the direction X, which is the direction perpendicular to the side surfaces 101 and 103.

In addition, in the present step, the amount by which the side surfaces 101 and 103 are etched is preferably smaller than or equal to 1 μm. When the amount by which the side surfaces 101 and 103 are etched exceeds 1 μm, each portion of the vibration substrate 2 excluding the stepped portions 107, for example, the first surface 2A, the second surface 2B, the first grooves 221 and 231, and the second grooves 222 and 232 are wet-etched, so that the outer shape of the vibration element 1 undesirably has dimensions different from desired values. The vibration element 1 can therefore undesirably vibrate at a frequency far off a desired frequency. Maintaining the amount by which the side surfaces 101 and 103 are etched smaller than or equal to 1 μm allows suppression of deviation from the desired frequency.

Furthermore, in the present step, the amount by which the side surfaces 101 and 103 are etched is preferably smaller than or equal to 0.5 μm. When the amount by which the side surfaces 101 and 103 are etched exceeds 0.5 μm, the corners of the vibrating arms 22 and 23, where the first surface 2A and the second surface 2B are coupled to the side surfaces 101 and 103, and other portions are wet-etched, resulting in a complicated shape of the vibration element 1 that differs from a desired shape. Unwanted vibration may therefore occur when the vibration element 1 is caused to vibrate, resulting in deterioration of the vibration characteristics, such as the Q value. Maintaining the amount by which the side surfaces 101 and 103 are etched smaller than or equal to 0.5 μm allows suppression of occurrence of undesired vibration.

A plurality of vibration substrates 2 are collectively formed from the quartz crystal substrate 20 by executing steps S1 to S6 described above.

Electrode Formation Step S7

A metal film is deposited at the front surface of the vibration substrate 2, and the metal film is patterned to form the electrode 3.

The vibration element 1 is thus manufactured.

As described above, the dry etching allows processing without being affected by the crystal planes of the quartz crystal, thus achieving excellent dimensional accuracy. Forming the first grooves 221 and 231, the second grooves 222 and 232, and the outer shape of the vibration substrate 2 all at once allows reduction in the number of steps of manufacturing the vibration element 1 and the cost of the vibration element 1. Furthermore, positional shift of the first grooves 221 and 231 and the second grooves 222 and 232 from the outer shape is prevented, whereby the accuracy of formation of the vibration substrate 2 increases.

The wet etching allows reduction in the size of the stepped portions 107 formed at the side surface 101 of the first vibrating arm 22 and the side surface 103 of the second vibrating arm 23 when the quartz crystal substrate 20 is dry-etched from both the sides facing the first surface 2A and the second surface 2B. The smaller stepped portions 107 can suppress unwanted vibration that occurs when the vibration element 1 is caused to vibrate and damage made to the vibration element 1 when impact acts thereon.

The method for manufacturing the vibration element 1 has been described above.

The conditions under which the micro-loading effect more reliably manifests itself will next be described with reference to FIGS. 16 and 17.

Figure 16:
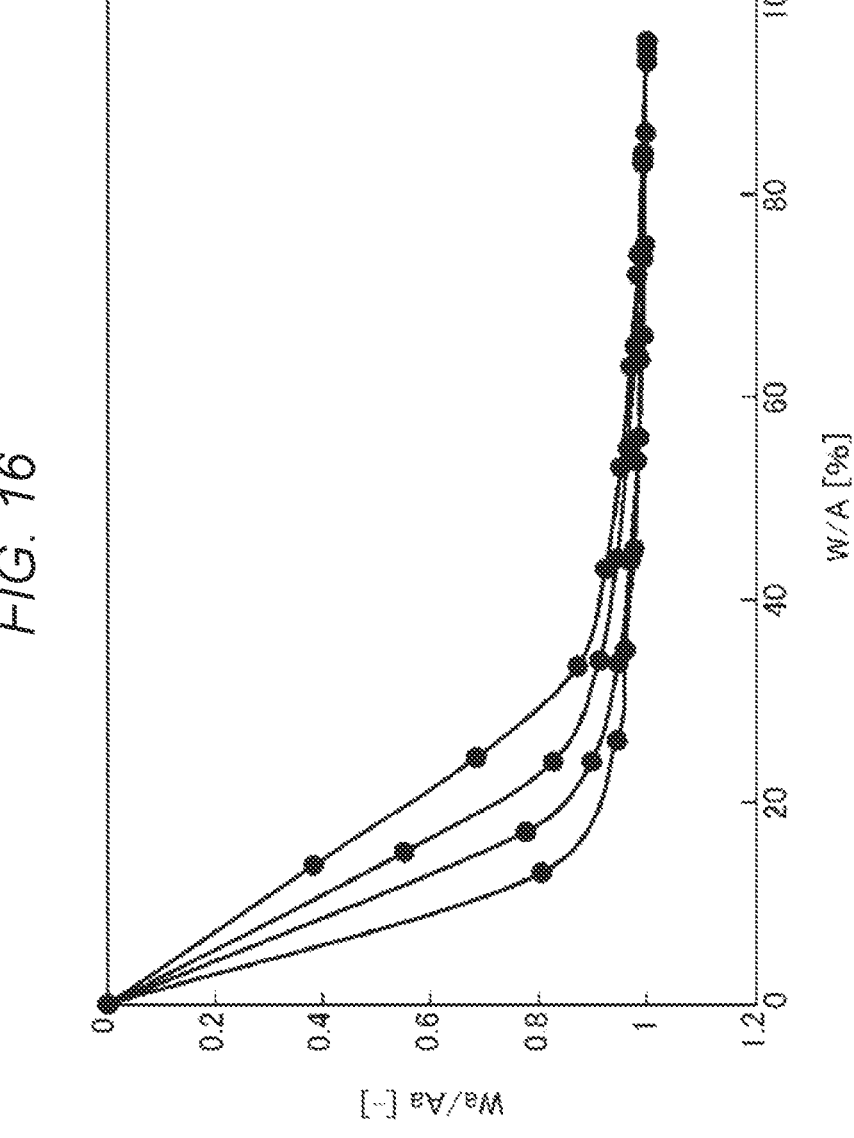
FIG. 16 shows graphs illustrating the relationship between W/A and Wa/Aa for different etching periods.

FIG. 16 shows the relationship between W/A and Wa/Aa for different etching periods. As can be seen from FIG. 16, the micro-loading effect notably manifests itself at each point of time in the region where W/A ≤40% is satisfied.

The micro-loading effect manifests itself in a variety of manners in accordance with the type of reaction gas used in the dry etching. FIG. 17 shows the relationship between W/A and Wa/Aa in a case where three typical reaction gases different from one another are used.

For example, when a fluorine-based gas having a large carbon content, such as $C_2F_4$, $C_2F_6$, $C_3F_6$, and $C_4F_8$, is used as the reaction gas, a thick sidewall protective film is produced, and the slope of the graph representing the relationship decreases, as in the case of a gas type G3. Wa/Aa therefore tends to increase with the width A being smaller than the width W, whereby the size of the vibration element 1 can be reduced. For example, to design the frequency and the CI value of the vibration element 1, a width W greater than or equal to a certain value and a depth Wa close to the depth Aa are required in some cases. In the design process, the width A needs to be a small value to reduce the size of the vibration element 1, and at least one of $C_2F_4$, $C_2F_6$, $C_3F_6$, and $C_4F_8$ is particularly effective in this case.

On the other hand, when a fluorine-based gas containing little or no carbon, such as $SF_6$ and $CF_4$, is used alone or in combination with a fluorine-based gas having a large carbon content, a thin sidewall protective film is produced, and the slope of the graph increases, as in the case of a gas type G1. The width A can therefore be greater than the width W with the depth Wa maintained greater than the depth Aa. For example, when it is desired to achieve a narrow first vibrating arm 22 and second vibrating arm 23 but a large width A while achieving a large depth Wa, at least one of $SF_6$ and $CF_4$ is particularly effective.

Let x be W/A and y be Wa/Aa, and the gas type G1 is expressed by Expression (1) below, a gas type G2 is expressed by Expression (2) below, and the gas type G3 is expressed by Expression (3) below.

$$y=-4.53\times10^{-6}x^4+3.99\times10^{-4}x^3-1.29\times10^{-3}x^2+1.83\times10^{-1}x \quad (1)$$

$$y=-5.59\times10^{-8}x^4+1.48\times10^{-5}x^3-1.43\times10^{-3}x^2+6.09\times10^{-2}x \quad (2)$$

$$y=-6.90\times10^{-10}x^4+5.47\times10^{-7}x^3-1.59\times10^{-4}x^2+2.03\times10^{-2}x \quad (3)$$

Figure 17:
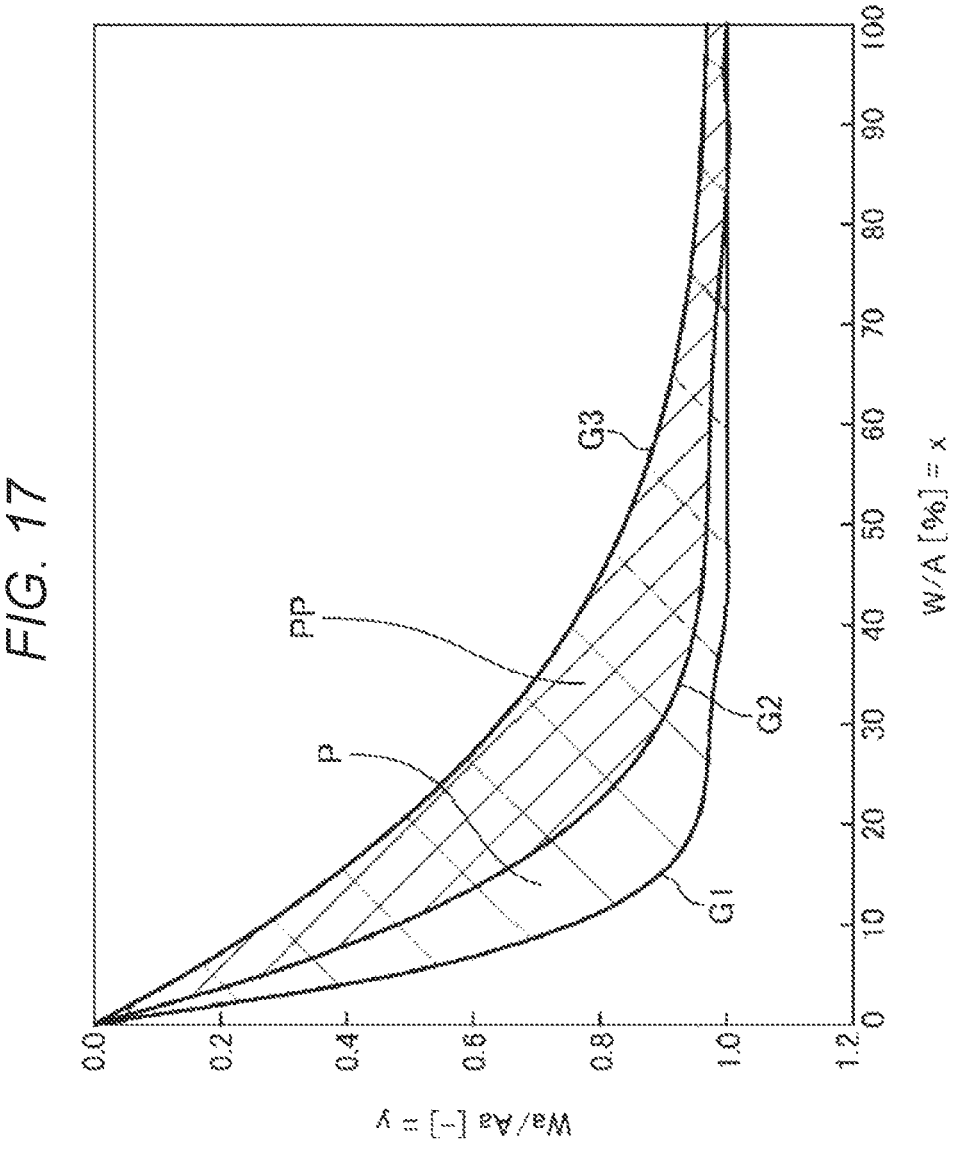
FIG. 17 shows graphs illustrating the relationship between W/A and Wa/Aa for different reaction gases.

When y is in a region P between the graphs expressed by Expressions (1) and (3), as shown in FIG. 17, that is, when y satisfies Expressions (4) and (5) below, the micro-loading effect more reliably manifests itself with a typical reaction gas. Therefore, the vibration element 1 can be readily manufactured, and the manufacturing cost thereof can be reduced.

$$y\geq-4.53\times10^{-6}x^4+3.99\times10^{-4}x^2-1.29\times10^{-3}x^2+1.83\times10^{-1}x \quad (4)$$

$$y\leq-6.90\times10^{-10}x^4+5.47\times10^{-7}x^3-1.59\times10^{-4}x^2+2.03\times10^{-2}x \quad (5)$$

When y does not satisfy Expression (4), the change in the depth Wa is greater than the change in the width W, so that the depth Wa may undesirably vary. The variation can be suppressed by y that satisfies Expression (4). When y does not satisfy Expression (5), it is difficult to increase y in regions where x is large, and the depth Wa decreases. To increase the depth Wa, a condition closer to W=A needs to be achieved, which tends to cause geometrical constraints. The geometrical constraints can be suppressed by y that satisfies Expression (5).

For example, when the width W and the depth Wa are fixed, selecting the gas type G2 allows reduction in the width A as compared with the width A achieved when the gas type G1 is selected and therefore allows reduction in the size of the vibration element 1. Selecting the gas type G3 allows further reduction in the width A as compared with the width A achieved when the gas type G2 is selected and therefore allows further reduction in the size of the vibration element 1. As described above, from the viewpoint of size reduction, it is preferable that y is in the region P, and it is more preferable that y is in a region PP between the graphs expressed by Expressions (2) and (3). That is, it is preferable that y satisfies Expression (6) below and Expression (5) described above.

$$y\geq-5.59\times10^{-8}x^4+1.48\times10^{-5}x^3-1.43\times10^{-3}x^2+6.09\times10^{-2}x \quad (6)$$

The effect of improvement of the CI value of the vibration element 1 provided when the first grooves 221 and 231 and the second grooves 222 and 232 are formed will next be described with reference to FIG. 18.

Figure 18:
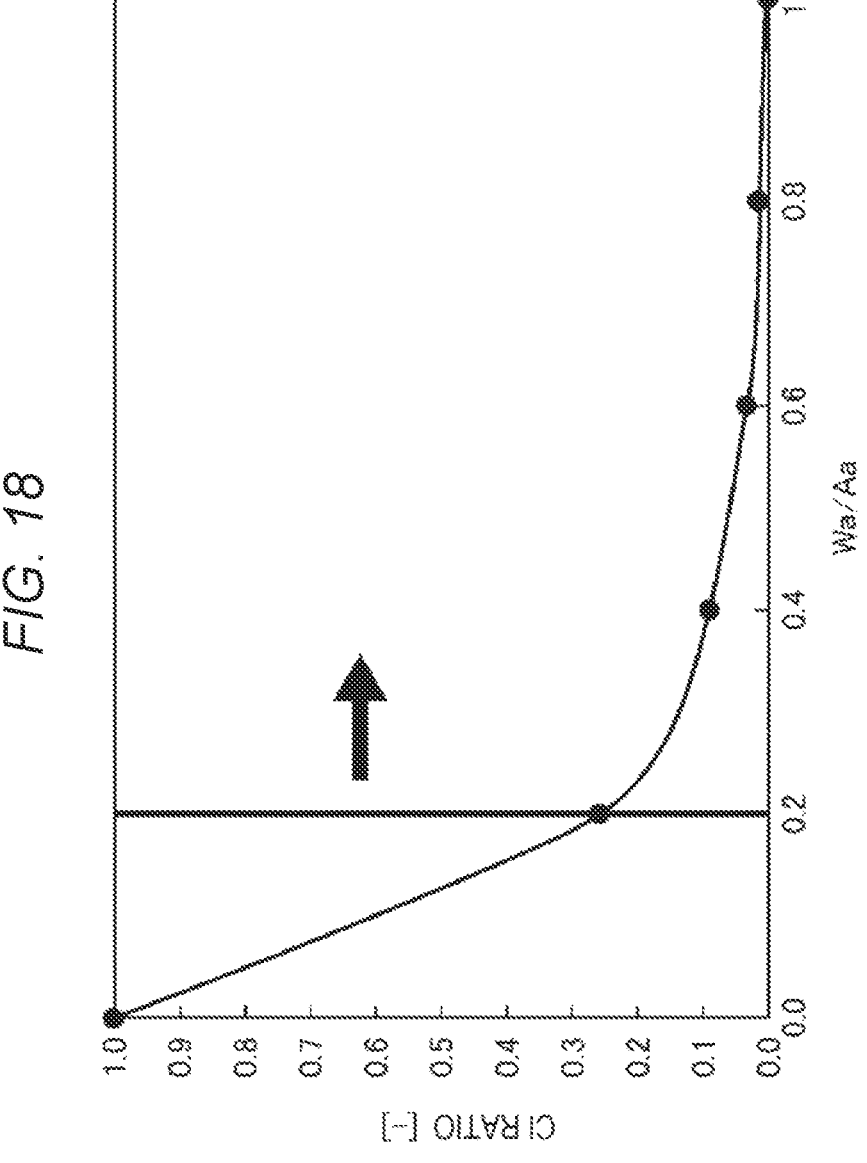
FIG. 18 shows graph a illustrating the relationship between Wa/Aa and a CI ratio.

FIG. 18 shows the relationship between Wa/Aa and a CI ratio. The CI ratio is a normalized CI value of the vibration element 1, provided that the CI value of the vibration element 1 manufactured under the condition that none of the first grooves 221 and 231 and the second grooves 222 and 232 is formed is regarded as 1.0. It is preferable that Wa/Aa ≥0.2 is satisfied, as shown in FIG. 18. Note that Wa/Aa <1 is satisfied in the present embodiment, in which the micro-loading effect is used. The condition described above allows reduction in the CI value to at least 30% of the CI value achieved when none of the first grooves 221 and 231 and the second grooves 222 and 232 is formed. A vibration element 1 excellent vibration having characteristics can therefore be manufactured. It is further preferable that Wa/Aa ≥0.4 is satisfied, in which case, the CI value can be reduced to at least 10% of the CI value achieved when none of the first grooves 221 and 231 and the second grooves 222 and 232 is formed.

The conditions under which the micro-loading effect more reliably manifests itself in the method for manufacturing the vibration element 1 have been described above.

As described above, the method for manufacturing the vibration element 1 is a method for manufacturing a vibration element that includes the first vibrating arm 22 and the second vibrating arm 23, which extend along the direction Y, which is the first direction, and are arranged side by side along the direction X, which is the second direction and intersects with the direction Y, the first vibrating arm 22 and the second vibrating arm 23 each having the first surface 2A and the second surface 2B, which are front and rear sides with respect with each other and are arranged side by side in the direction Z, which is the third direction and intersects with the directions X and Y, the first vibrating arm 22 and the second vibrating arm 23 further having the bottomed first grooves 221 and 231, which open to the first surface 2A, the bottomed second grooves 222 and 232, which open to the second surface 2B, and the side surfaces 101 and 103, which couple the first surface 2A and the second surface 2B to each other, the method including the preparation step S1 of preparing the quartz crystal substrate 20 having the first surface 2A and the second surface 2B, the first dry etching step S3 of dry-etching the quartz crystal substrate 20 from the side facing the first surface 2A to form the first grooves 221 and 231 and the outer shapes of the first vibrating arm 22 and the second vibrating arm 23, the second dry etching step S5 of dry-etching the quartz crystal substrate 20 from the side facing the second surface 2B to form the second grooves 222 and 232 and the outer shapes of the first vibrating arm 22 and the second vibrating arm 23, and the subsequent wet etching step S6 of wet-etching the side surfaces 101 and 103 of the first vibrating arm 22 and the second vibrating arm 23, the first grooves 221 and 231, and the second grooves 222 and 232 to form the inclining surfaces 114 and 115, which couple the bottom surfaces 111 of the first grooves 221 and 231 and the second grooves 222 and 232 to the in-groove side surfaces 112 and 113, and the first grooves 221 and 231 and the second grooves 222 and 232 satisfy D1/D ≥ 0.80, where D represents the depth of the first grooves 221 and 231 and the second grooves 222 and 232, and D1 represents the result of subtraction of the length of the inclining surface 114 in the direction Z from the depth.

According to the manufacturing method described above, the size of the stepped portions 107 formed at the side surfaces 101 and 103 of the first vibrating arm 22 and the second vibrating arm 23 can be reduced. The stepped portions 107 having the reduced size can suppress unwanted vibration that occurs when the vibration element 1 is caused to vibrate and damage made to the vibration element 1 when impact acts thereon. Furthermore, the dry ratio D1/D satisfies D1/D ≥0.80, whereby the Q value can be improved, as described above.

In the method for manufacturing the vibration element 1, it is preferable that the first grooves 221 and 231 and the second grooves 222 and 232 are formed under the condition that the dry ratio D1/D satisfies D1/D ≥0.85, as described above. The Q value can thus be improved.

In the method for manufacturing the vibration element 1, it is preferable that the amount by which the side surfaces 101 and 103 are etched in the wet etching step S6 is greater than or equal to 0.01 μm, as described above. The thus set etching amount reduces the size of the stepped portions 107, preventing unwanted vibration from occurring when the vibration element 1 is caused to vibrate and the vibration element 1 from being damaged when impact acts thereon.

In the method for manufacturing the vibration element 1, it is preferable that the amount by which the side surfaces 101 and 103 are etched in the wet etching step S6 is smaller than or equal to 1 μm, as described above. Deviation from the desired frequency that occurs when the vibration element 1 is caused to vibrate can thus be suppressed.

In the method for manufacturing the vibration element 1, it is preferable that the amount by which the side surfaces 101 and 103 are etched in the wet etching step S6 is smaller than or equal to 0.5 μm, as described above. Unwanted vibration that occurs when the vibration element 1 is caused to vibrate can thus be suppressed.

In the method for manufacturing the vibration element 1, it is preferable that Wa/Aa <1 is satisfied in at least one of the first dry etching step S3 and the second dry etching step S5, as described above, where Wa represents the depth of the first grooves 221 and 231 formed in the first dry etching step S3 and the depth of the second grooves 222 and 232 formed in the second dry etching step S5, and Aa represents the depth of the outer shapes of the first vibrating arm 22 and the second vibrating arm 23 formed in the first dry etching step S3 and the depth of the outer shapes of the first vibrating arm 22 and the second vibrating arm 23 formed in the second dry etching step S5. The first grooves 221 and 231, the second grooves 222 and 232, and the outer shape of the vibration substrate 2 can thus be formed all at once. The number of steps of manufacturing the vibration element 1 and the cost of the vibration element 1 can therefore be reduced. Furthermore, positional shift of the first grooves 221 and 231 and the second grooves 222 and 232 from the outer shape is prevented, whereby the accuracy of formation of the vibration substrate 2 increases.

2. Second Embodiment

Figure 19:
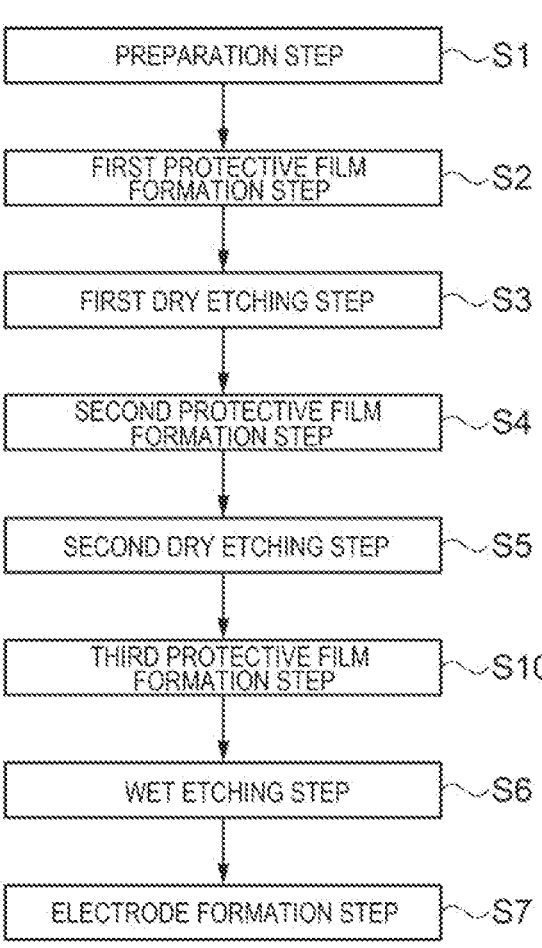
FIG. 19 shows steps of manufacturing the vibration element according to a second embodiment.

The method for manufacturing the vibration element 1 according to a second embodiment will be described with reference to FIGS. 19 to 21. The same components as those in the first embodiment have the same reference characters, and no redundant description of the same components will be made.

The second embodiment is the same as the first embodiment except that a third protective film formation step S10 is provided between the second dry etching step S5 and the wet etching step S6, that third protective films 109 are formed at the first surface 2A and the second surface 2B of the quartz crystal substrate 20 in the third protective film formation step S10, and that the first surface 2A and the second surface 2B of the quartz crystal substrate 20 is masked by the third protective film 109 in the wet etching process S6.

The method for manufacturing the vibration element 1 according to the second embodiment includes preparation step S1 of preparing the quartz crystal substrate 20, which is the base material of the vibration substrate 2, the first protective film formation step S2 of forming the first protective film 5 at the first surface 2A of the quartz crystal 20, the first dry etching step S3 of dry-etching the quartz crystal substrate 20 from the side facing the first surface 2A via the first protective film 5, the second protective film formation step S4 of forming the second protective film 6 at the second surface 2B of the quartz crystal substrate 20, the second dry etching step S5 of dry-etching the quartz crystal substrate 20 from the side facing the second surface 2B via the second protective film 6, the third protective film formation step S10 of forming the third protective films 109 at the first surface 2A and the second surface 2B of the quartz crystal substrate 20, the wet etching step S6 of wet-etching the quartz crystal substrate 20, and the electrode formation step S7 of forming the electrode 3 at the front surface of the vibration substrate 2 produced by the steps described above, as shown in FIG. 19.

The preparation step S1 to the second dry etching step S5 are the same as those in the first embodiment and will therefore not be described, and the third protective film formation step S10 and the following steps will be described. The second protective film 6 and the metal film M2 are removed from the quartz crystal substrate 20 after the completion of the second dry etching step S5, as in the first embodiment.

Third Protective Film Formation Step S10

Figure 20:
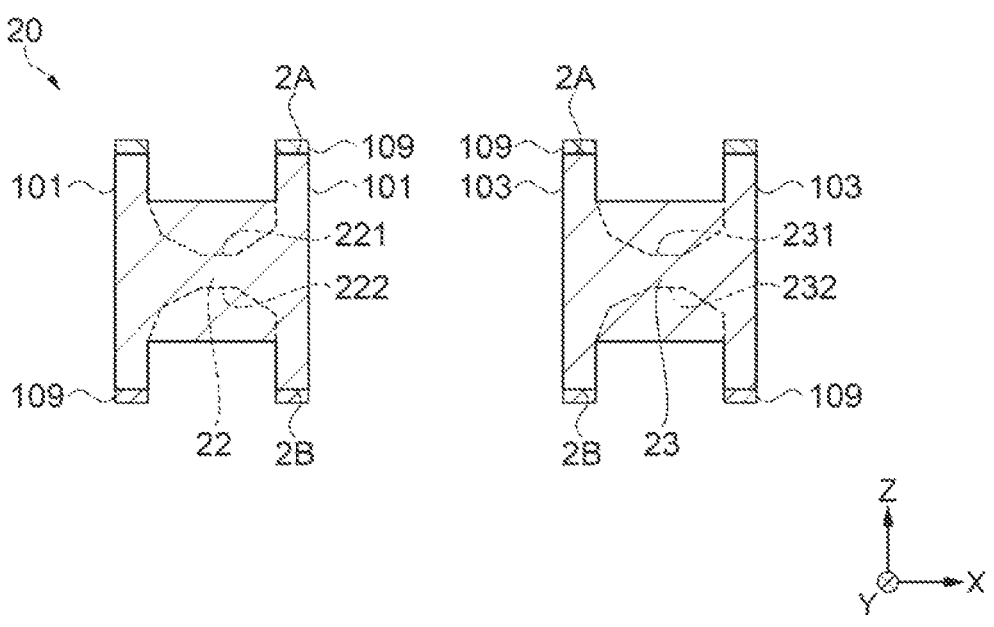
FIG. 20 is a cross-sectional view for describing the method for manufacturing the vibration element.

The third protective films 109 are formed at the first surface 2A and the second surface 2B of the quartz crystal substrate 20, as shown in FIG. 20. The third protective films 109 are each, for example, a metal film formed by sequentially depositing chromium and gold from the side facing the quartz crystal substrate 20. The third protective films 109 can be formed by depositing the metal films at the surfaces of the quartz crystal substrate 20, for example, by using sputtering or chemical vapor deposition (CVD) and patterning the metal films by using photolithography and etching techniques.

Wet Etching Step S6

In the present step, the quartz crystal substrate 20 is wet-etched by immersing the quartz crystal substrate 20 in an etchant.

In the second embodiment, prior to the present step, the third protective films 109 are formed at the first surface 2A and the second surface 2B of the quartz crystal substrate 20 in the third protective film formation step S10. Therefore, in the present step, the first surface 2A and the second surface 2B of the quartz crystal substrate 20 are masked by the third protective films 109. In other words, the first surface 2A and the second surface 2B of the first vibrating arm 22 and the second vibrating arm 23 are masked by the third protective films 109. That is, the first surface 2A and the second surface 2B of the first vibrating arm 22 and the second vibrating arm 23 are not wet-etched in the present step. The masking third protective films 109 prevents the dimensions and shape of the vibration element 1 from being different from the desired dimensions and shape. Deviation from the desired frequency and occurrence of unwanted vibration of the vibration element 1 can thus be suppressed.

Since no third protective film 109 is formed at the side surface 101 of the first vibrating arm 22 and the side surface 103 of the second vibrating arm 23, the size of the stepped portions 107 formed at the side surfaces 101 and 103 can be reduced, as in the first embodiment.

Figure 21:
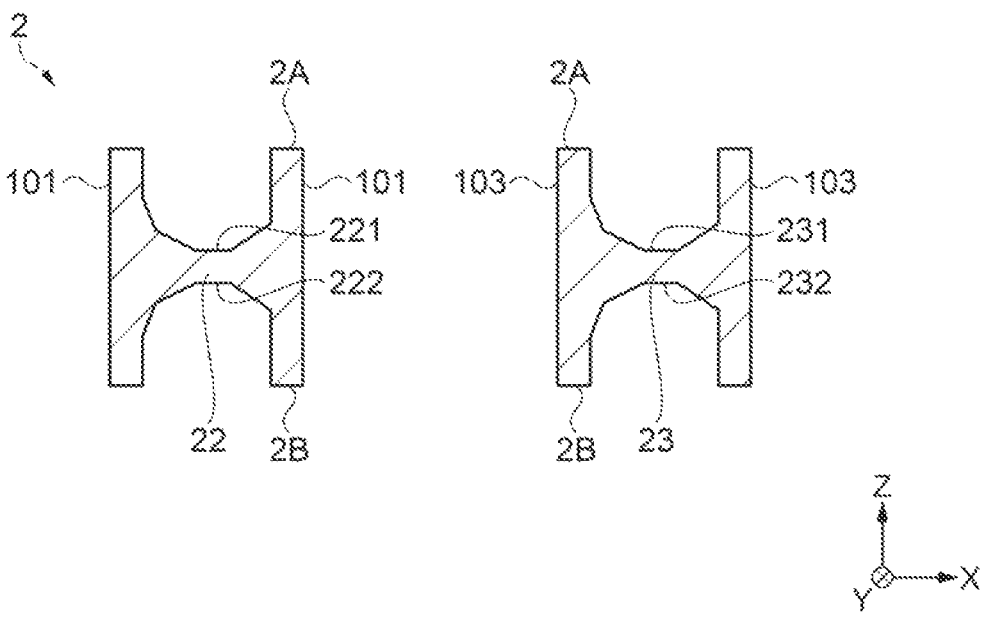
FIG. 21 is a cross-sectional view for describing the method for manufacturing the vibration element.

After the present step is completed, the third protective films 109 are removed, as shown in FIG. 21. A plurality of vibration substrates 2 are thus collectively formed from the quartz crystal substrate 20.

Electrode Formation Step S7

The present step is executed in the same manner as in the first embodiment. A metal film is deposited at the front surface of the vibration substrate 2, and the metal film is patterned to form the electrode 3.

The vibration element 1 is thus manufactured.

The present embodiment can provide the following effect in addition to the effects provided by the first embodiment.

In the wet etching step S6, the first surface 2A and the second surface 2B of the quartz crystal substrate 20 are masked by the third protective films 109, which prevent the dimensions and shape of the vibration device 1 from being different from the desired dimensions and shape. Deviation from the desired frequency and occurrence of unwanted vibration of the vibration element 1 can thus be suppressed.

The vibration element manufacturing method according to the present disclosure has been described above based on the first and second embodiments.

The present disclosure is, however, not limited thereto, and the configuration of each portion can be replaced with any configuration having the same function. Furthermore, any other constituent element may be added to any of the embodiments of the present disclosure. Moreover, the embodiments may be combined as appropriate with each other.

For example, in the embodiments described above, Wa/Aa <1 is satisfied in each of the first dry etching step S3 and the second dry etching step S5, but not necessarily, and Wa/Aa <1 only needs to be satisfied in at least one of the steps.

Figure 22:
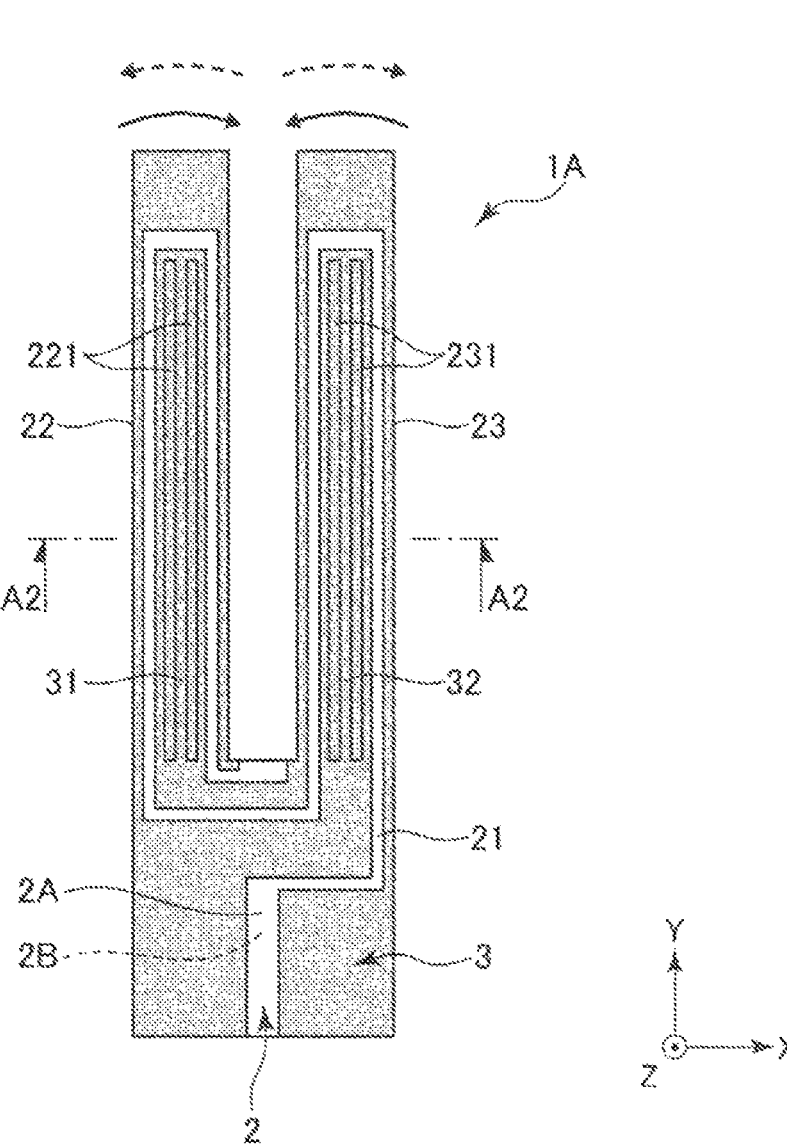
FIG. 22 is a plan view showing a variation of the vibration element.
Figure 23:
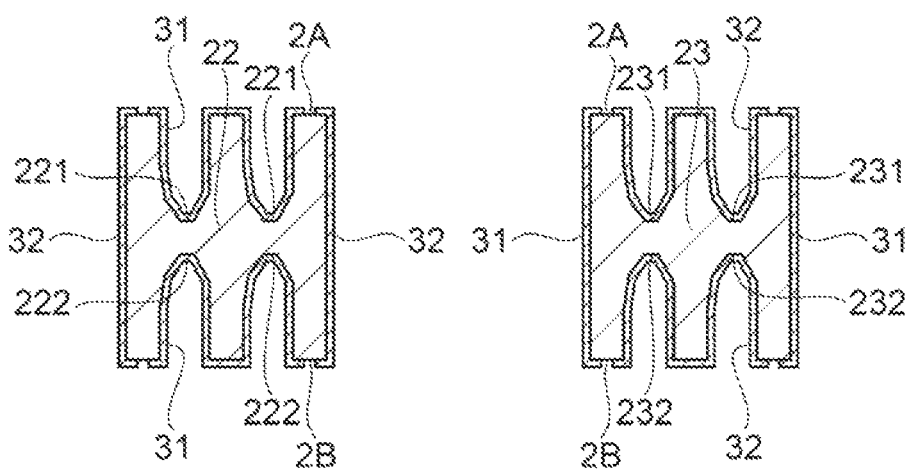
FIG. 23 is a cross-sectional view of the vibration element taken along the line A2-A2 in FIG. 22.
Figure 23:

The vibration element manufactured by the vibration element manufacturing method according to the present disclosure is not limited to a specific device and may, for example, be a vibration element 1A shown in FIGS. 22 and 23. In the vibration device 1A, a pair of first grooves 221 are formed side by side in the direction X at the first surface 2A of the first vibrating arm 22, and a pair of second grooves 222 are formed side by side in the direction X at the second surface 2B of the first vibrating arm 22. Similarly, a pair of first grooves 231 are formed side by side in the direction X at the first surface 2A of the second vibrating arm 23, and a pair of second grooves 232 are formed side by side in the direction X at the second surface 2B of the second vibrating arm 23. In the configuration described above, the width W of each of the grooves tends to decrease because a plurality of grooves are arranged in one direction. It is therefore preferable to use at least one of $SF_6$ and $CF_4$ as the reaction gas in the first dry etching step S3 and the second dry etching step S5. The depth of each of the grooves can therefore be a deep groove, whereby the CI value can be lowered.

Figure 24:
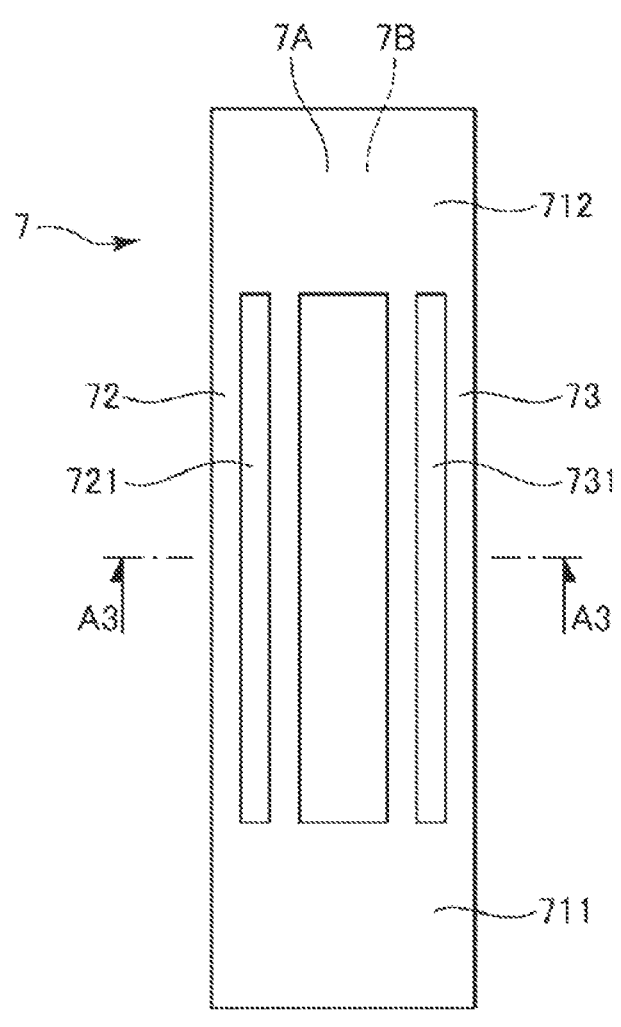
FIG. 24 is a plan view showing another variation of the vibration element.
Figure 24:
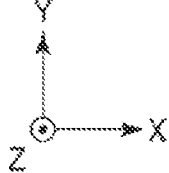
Figure 25:
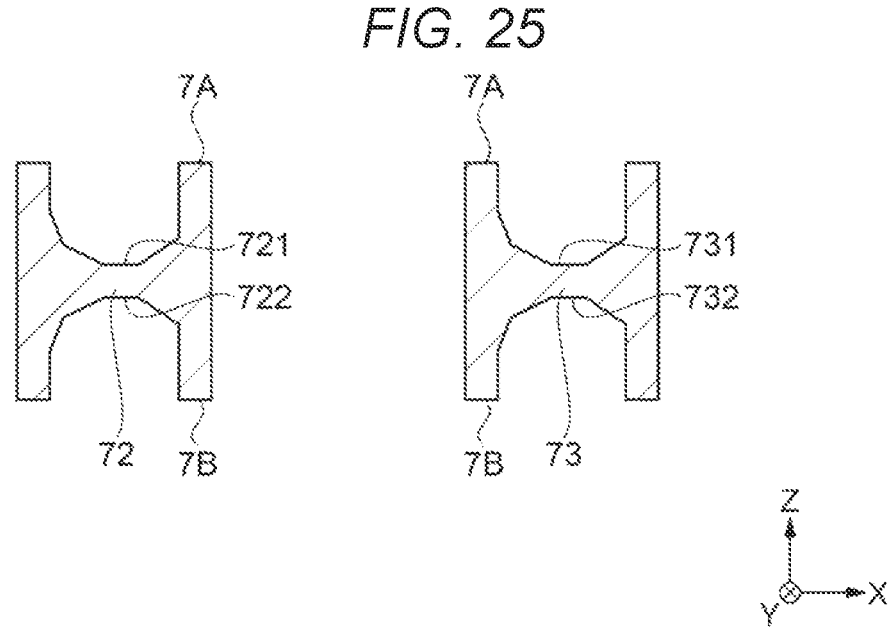
FIG. 25 is a cross-sectional view of the vibration element taken along the line A3-A3 in FIG. 24.

The vibration device may instead be a double-tuning-fork-type vibration device 7 shown in FIGS. 24 and 25. Note that no electrode is shown in FIGS. 24 and 25. The double-tuning-fork-type vibration element 7 includes a pair of bases 711 and 712, and a first vibrating arm 72 and a second vibrating arm 73, which link the bases 711 and 712 to each other. The first vibrating arm 72 and the second vibrating arm 73 have bottomed first grooves 721 and 731, which open to a first surface 7A, and bottomed second grooves 722 and 732, which open to a second surface 7B.

Figure 26:
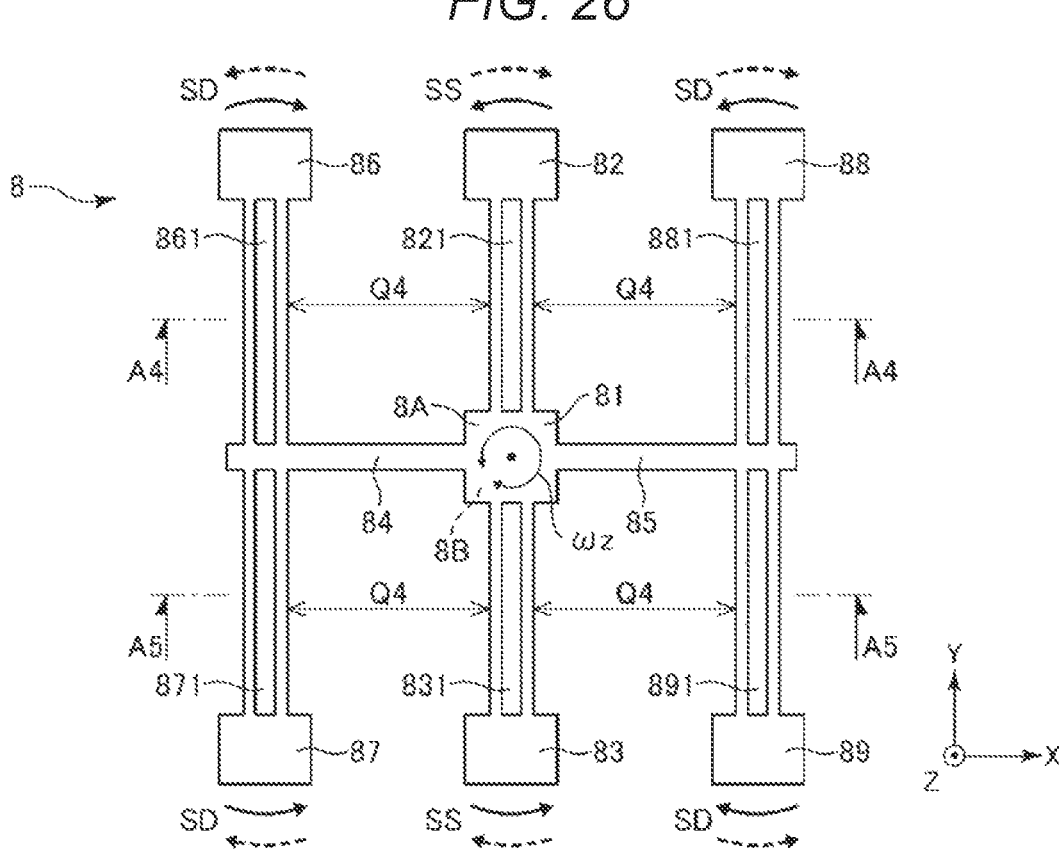
FIG. 26 is a plan view showing another variation of the vibration element.
Figure 27:
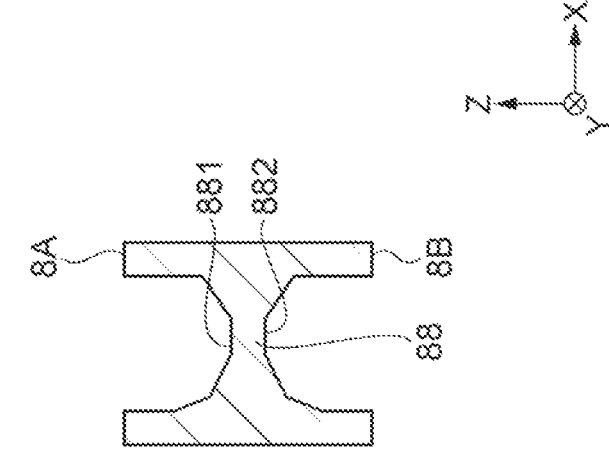
FIG. 27 is a cross-sectional view of the vibration element taken along the line A4-A4 in FIG. 26.
Figure 27:
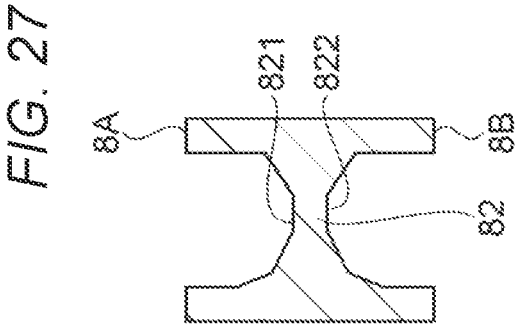
Figure 27:
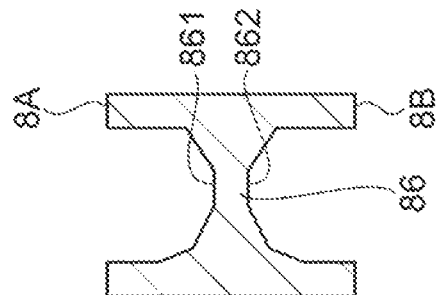

The vibration element may still instead, for example, be a gyro vibration element 8 shown in FIGS. 26 to 28. No electrode is shown in FIGS. 26 to 28. The gyro vibration element 8 includes a base 81, a pair of detection vibration arms 82 and 83, which extend from the base 81 toward opposite sides of the direction Y, a pair of linkage arms 84 and 85, which extend from the base 81 toward opposite sides of the direction X, drive vibration arms 86 and 87, which extend from the tip of the linkage arm 84 toward opposite sides of the direction Y, and drive vibration arms 88 and 89, which extend from the tip of the linkage arm 85 toward opposite sides of the direction Y. When an angular velocity ωz around the axis Z acts on the thus configured gyro vibration element 8 with the drive vibration arms 86, 87, 88, and 89 undergoing flexural vibration in the direction labeled with an arrows SD in FIG. 26, the Coriolis force newly excites flexural vibration of the detection vibration arms 82 and 83 in the direction labeled with an arrows SS, and the angular velocity ωz is detected based on the electric charges outputted from the detection vibration arms 82 and 83 due to the flexural vibration.

The detection vibration arms 82 and 83 have bottomed first grooves 821 and 831, which open to a first surface 8A, and bottomed second grooves 822 and 832, which open to a second surface 8B. The driving vibrating arms 86, 87, 88, and 89 have bottomed first grooves 861, 871, 881, and 891, which open to the first surface 8A, and bottomed second grooves 862, 872, 882, and 892, which open to the second surface 8B. In the thus configured gyro vibration element 8, for example, pairs of vibrating arms adjacent to each other in the direction X, such as the detection vibration arm 82 and the drive vibration arm 86, the detection vibration arm 82 and the drive vibration arm 88, the detection vibration arm 83 and the drive vibration arm 87, and the detection vibration arm 83 and the drive vibration arm 89, can be regarded as the first and second vibrating arms.

In the case of the gyro vibration element 8, the inter-arm areas Q4 each need to have a large size for a structural reason. In such a case, the depth Wa may decrease in the region between the graphs expressed by Expressions (2) and (3) described above, undesirably resulting a decrease in sensitivity. It is therefore preferable to use the region between the graphs expressed by Expressions (1) and (2) described above.

Figure 29:
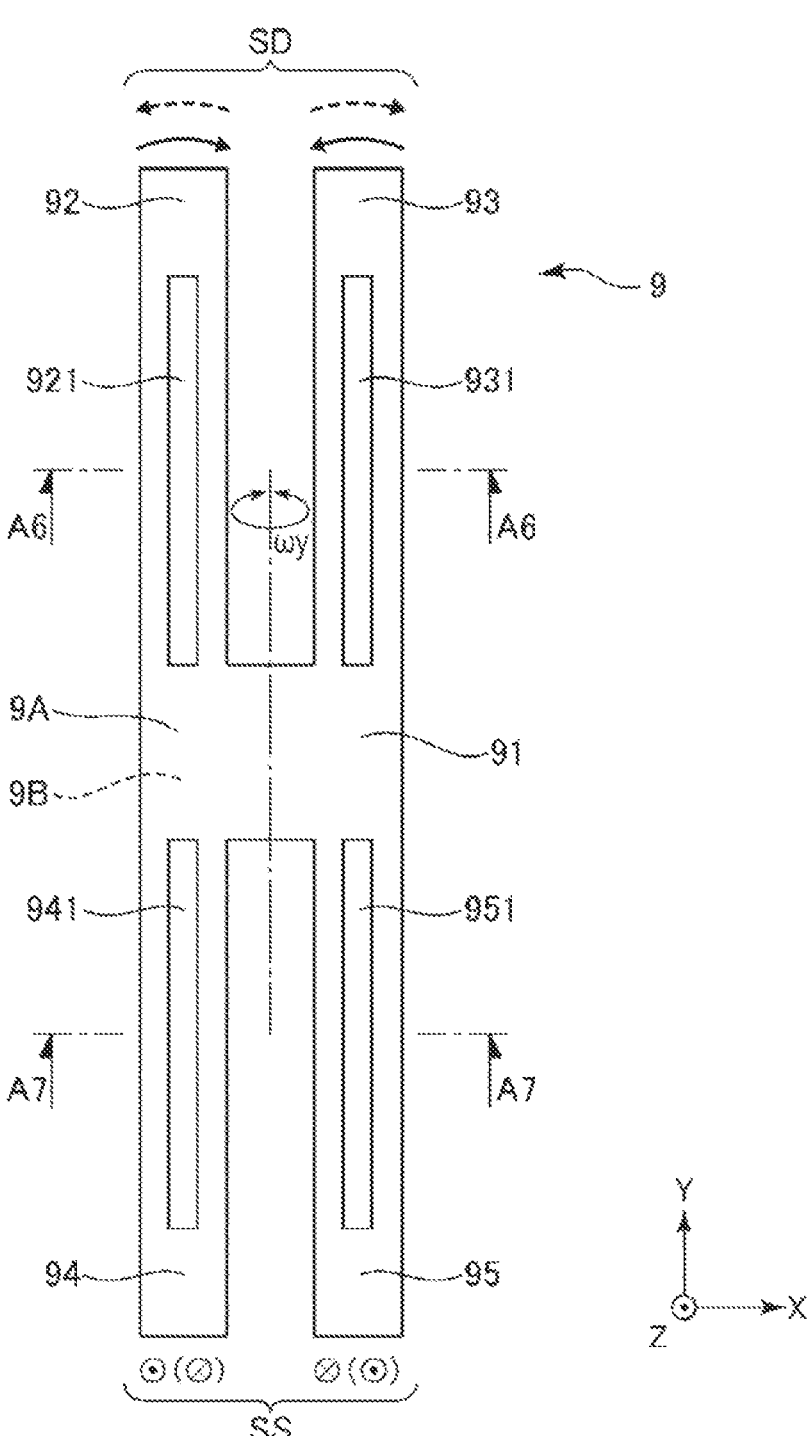
FIG. 29 is a plan view showing another variation of the vibration element.
Figure 30:
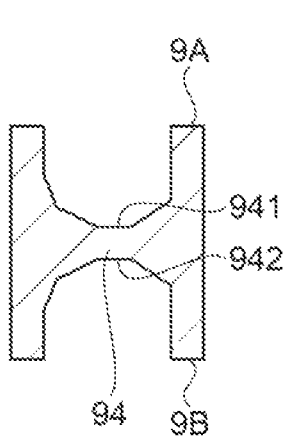
FIG. 30 is a cross-sectional view of the vibration element taken along the line A6-A6 in FIG. 29.
Figure 30:
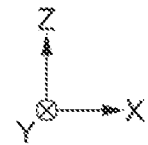
Figure 31:
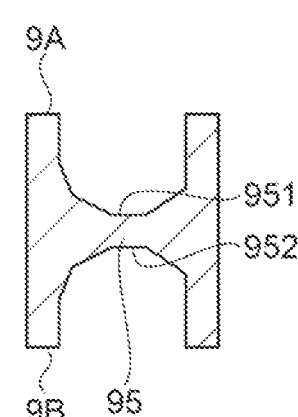
FIG. 31 is a cross-sectional view of the vibration element taken along the line A7-A7 in FIG. 29.
Figure 31:
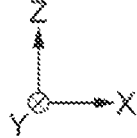

The vibration element may still instead, for example, be a gyro vibration element 9 shown in FIGS. 29 to 31. The gyro vibration element 9 has a base 91, a pair of drive vibration arms 92 and 93, which extend from the base 91 toward the positive side of the direction Y and arranged side by side in the direction X, and a pair of detection vibration arms 94 and 95, which extend from the base 91 toward the negative side of the direction Y and arranged side by side in the direction X. When an angular velocity ωy around the axis Y acts on the thus configured gyro vibration element 9 with the drive vibration arms 92 and 93 undergoing flexural vibration in the direction labeled with the arrows SD in FIG. 29, the Coriolis force newly excites flexural vibration of the detection vibration arms 94 and 95 in the direction labeled with the arrows SS, and the angular velocity ωy is detected based on the electric charges outputted from the detection vibration arms 94 and 95 due to the flexural vibration.

The drive vibration arms 92 and 93 have bottomed first grooves 921 and 931, which open to a first surface 9A, and bottomed second grooves 922 and 932, which open to a second surface 9B. The detection vibration arms 94 and 95 have bottomed first grooves 941 and 951, which open to the first surface 9A, and bottomed second grooves 942 and 952, which open to the second surface 9B. In the thus configured gyro vibration element 9, the drive vibration arms 92 and 93 or the detection vibration arms 94 and 95 form the first and second vibrating arms.

What is claimed is:

1. A method for manufacturing a vibration element, the method comprising steps of:

forming a first vibrating arm and a second vibrating arm extending along a first direction and arranged side by side along a second direction that intersects with the first direction, wherein, the first and second vibrating arms each have a first surface and a second surface being front and rear sides with respect to each other and arranged side by side in a third direction that intersects with the first and second directions, a bottomed first groove that opens to the first surface, a bottomed second groove that opens to the second surface, and a side surface that couples the first surface and the second surface to each other, preparing a quartz crystal substrate having the first surface and the second surface;

a first dry etching of the quartz crystal substrate from a first surface side to form the first groove and outer shapes of the first and second vibrating arms;

a second dry etching of the quartz crystal substrate from a second surface side to form the second groove and the outer shapes of the first and second vibrating arms; and a subsequent wet etching of the side surfaces of the first and second vibrating arms, the first groove, and the second groove to form inclining surfaces that couple bottom surfaces to in-groove side surfaces of the first and second grooves, wherein the first and second grooves satisfy a relationship ratio of D1/D greater or equal to 0.80 or 80%, where D represents a depth of each of the first and second grooves, and D1 represents a result of subtraction of a length of the inclining surfaces in the third direction from the depth in each of the first and second grooves.

2. The method for manufacturing the vibration element according to claim 1, wherein the first and second grooves satisfy a relationship ratio of D1/D greater or equal to 0.85 or 85%.

3. The method for manufacturing the vibration element according to claim 1, wherein the subsequent wet etching further comprises etching the side surfaces by an amount that is greater than or equal to 0.01 μm.

4. The method for manufacturing the vibration element according to claim 1, wherein the subsequent wet etching further comprises etching the side surfaces by an amount that is smaller than or equal to 1 μm.

5. The method for manufacturing the vibration element according to claim 1, wherein the subsequent wet etching further comprises etching the side surfaces by an amount that is smaller than or equal to 0.5 μm.

6. The method for manufacturing the vibration element according to claim 1, wherein the subsequent wet etching further comprises masking the first and second surfaces.

7. The method for manufacturing the vibration element according to claim 1, wherein a relationship ratio of Wa/Aa greater than 1 is satisfied in at least one of the first and second dry etching steps, where Wa represents a depth of the first groove formed in the first dry etching step or a depth of the second groove formed in the second dry etching step, and Aa represents a depth of each of the outer shapes formed in the first dry etching step or a depth of each of the outer shapes formed in the second dry etching step.

\* \* \* \* \*